United States Patent [19]

Takahashi

[11] Patent Number: 5,621,521

[45] Date of Patent: Apr. 15, 1997

[54] CHECKING APPARATUS FOR ARRAY ELECTRODE SUBSTRATE

[75] Inventor: Hironori Takahashi, Hamamatsu, Japan

[73] Assignee: Hamamatsu Photonics K.K., Hamamatsu, Japan

[21] Appl. No.: 513,560

[22] Filed: Aug. 10, 1995

[30] Foreign Application Priority Data

Sep. 7, 1994 [JP] Japan ................................. 6-213804

[51] Int. Cl.⁶ ............................................. G01N 21/00
[52] U.S. Cl. ..................... 356/237; 356/445; 356/444; 348/180; 345/904
[58] Field of Search ........................ 356/237, 445; 345/38, 87, 104; 368/242; 348/180–185, 191, 196, 197, 200, 134, 135, 98, 125

[56] References Cited

U.S. PATENT DOCUMENTS

| | | | |
|---|---|---|---|
| 4,435,064 | 3/1984 | Tsukada | 355/1 |
| 4,614,408 | 9/1986 | Mir | 350/388 |
| 4,750,822 | 6/1988 | Rosencwaig | 356/445 |
| 4,983,911 | 1/1991 | Henley | 324/158 |
| 5,074,669 | 12/1991 | Opsal | 356/445 |
| 5,097,201 | 3/1992 | Henley | 324/96 |
| 5,124,635 | 6/1992 | Henley | 234/96 |
| 5,227,642 | 7/1993 | Shimizu | 250/566 |

FOREIGN PATENT DOCUMENTS

| | | |
|---|---|---|
| 0297562 | 6/1988 | European Pat. Off. . |
| 0299432 | 7/1988 | European Pat. Off. . |
| 64-18071 | 1/1989 | Japan . |
| 64-18072 | 1/1989 | Japan . |
| 64-18073 | 1/1989 | Japan . |
| 64-9370 | 1/1989 | Japan . |
| 3-244141 | 10/1991 | Japan . |

OTHER PUBLICATIONS

Patent Abstracts of Japan, vol. 011, No. 253 (P–606), Aug. 18, 1987 and JP–A–62 058432 (Olympus Optical Co., Ltd.), Mar. 14, 1987.

Henley et al, "A High Speed Flat Panel In–Process Test System for TFT Array Using Electro–Optic Effects", IEICE Trans Electron., vol. E76–C, No. 1, Jan. 1993, pp. 64–67.

Kolner et al, "Electrooptic Sampling in GaAs Integrated Circuits", IEEE Journal of Quantum Electronics, vol. OE–22, No. 1, Jan. 1986, pp. 79–93.

Valdmanis et al, "Subpicosecond Electrooptic Sampling: Principles and Applications", IEEE Journal of Quantum Electronics, vol. OE–22, No. 1, Jan. 1986, pp. 69–78.

*Primary Examiner*—Frank Gonzalez
*Assistant Examiner*—Michael P. Stafira
*Attorney, Agent, or Firm*—Cushman Darby & Cushman, IP Group of Pillsbury Madison & Sutro, LLP

[57] ABSTRACT

Provided is a checking apparatus for array electrode substrate, which can check an array electrode substrate in non-contact and at high speed. A probe assembly includes a plurality of electro-optic probes arranged in the staggered relation. Since this arrangement uses a plurality of (for example, eight, sixteen, twenty, forty, etc.) small electro-optic probes, it becomes equivalent to an arrangement of an elongate electro-optic probe, thereby enabling simultaneous measurement of potentials of numerous unit electrodes. Namely, because a measurement light beam is incident into each electro-optic probe and each reflection-return light is detected by a photodector, potentials of unit electrodes in a number corresponding to the number of electro-optic probes can be simultaneously measured. Since deflection of the measurement light beams in the array direction is synchronized with relative movement between the electrode arrays and the probe assembly in a direction perpendicular to the array direction, after completion of measurement of an electrode array in a certain line, next measurement of an electrode array in a next line, can be started, as a result, enabling continuous potential measurement.

9 Claims, 17 Drawing Sheets

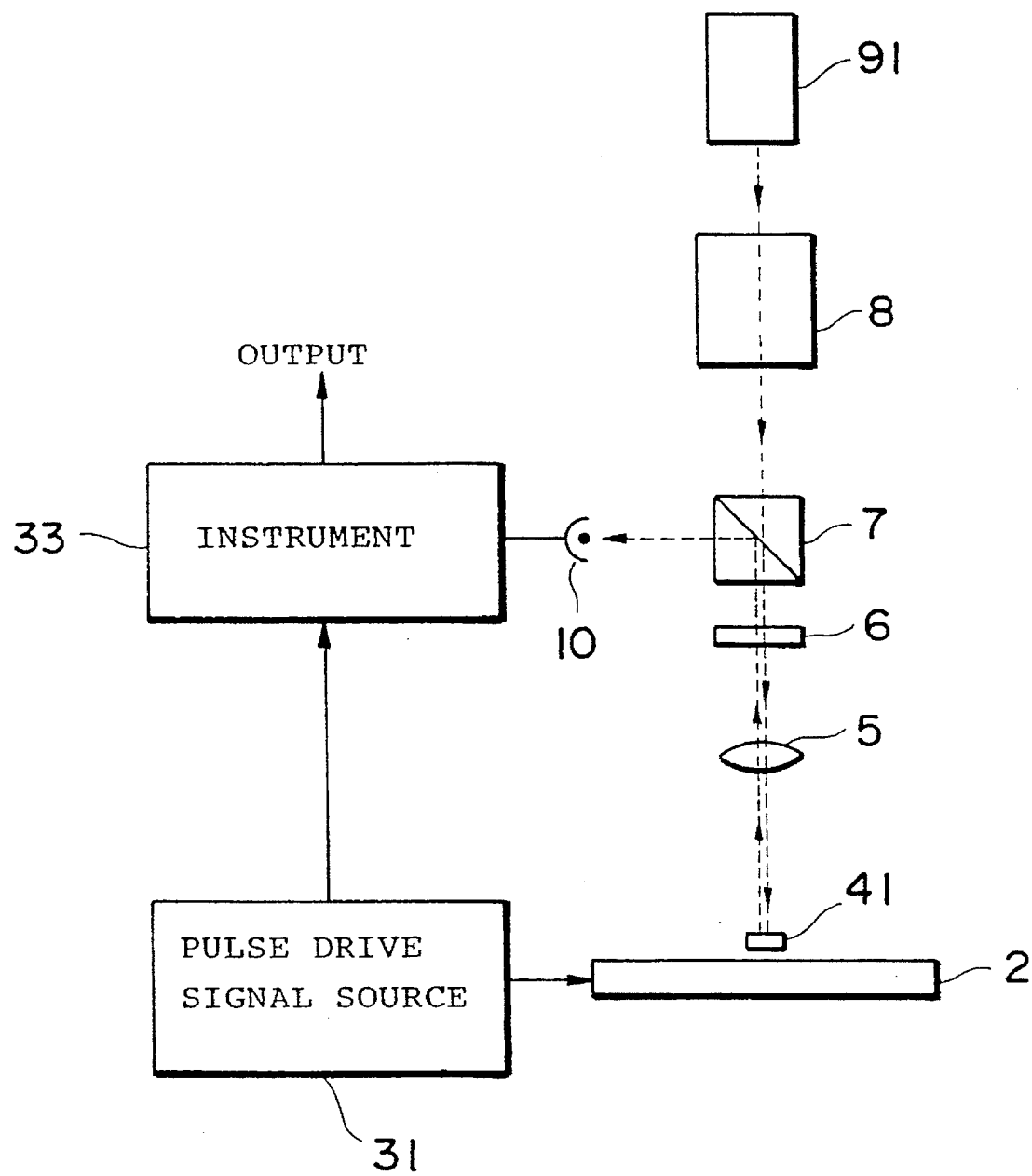

CHECKING APPARATUS FOR ARRAY ELECTRODE SUBSTRATE

BACKGROUND OF THE INVENTION

1. Field of the Invention

The present invention relates to a checking apparatus for checking electric properties of array electrode substrates, for example used in checking electrodes in a LCD panel (liquid crystal display panel).

2. Related Background Art

There are known apparatus for measuring a potential of an electrode on a panel, utilizing the electro-optic effect (E-O effect). With the apparatus, an electro-optic probe (E-O probe) made of a material having the electro-optic effect, is brought into the vicinity of the electrode to cause an index change according to an electric field, a laser light beam is radiated onto the electro-optic probe, and a change of a polarization state of reflection-return light is detected, there by checking the potential of the electrode on the pane.

The conventional technology of such apparatus is described, for example in Japanese Laid-open Patent Application No. 64-9370, Japanese Laid-open Patent Application No. 64-18071 (first reference), Japanese Laid-open Patent Application No. 64-18072, Japanese Laid-open Patent Application No. 64-18073, Japanese Laid-open Patent Application No. 3-244141 (second reference), "IEICE TRANS ELECTRON., VOL. E76-C, NO. 1 JANUARY 1993, PP64-67" (third reference), and "IEEE JOURNAL OF QUANTUM ELECTRONICS, VOL. QE-22, NO. 1, JANUARY 1986, PP69-78, PP79-93."

Among these, the first reference describes the technique that can be utilized for measuring potentials of many electrodes in an array electrode substrate such as a liquid crystal display panel, in which a large electro-optic probe is used and a linerary polarized measurement laser beam is scanned, thereby enabling measurement of a two-dimensional potential distribution. Further, the second and third references describe techniques which can allow simultaneous measurement of potential distribution in an area including a lot of electrodes by guiding parallel light with some spread to an electro-optic modulator, instead of a finely focused light beam.

SUMMARY OF THE INVENTION

It is, however, difficult to measure potentials of many electrodes disposed on the array electrode substrate quickly and accurately by limiting the measurement only to the electrodes. For example, because the technique of the first reference employs sequential scan of one measurement laser beam, it takes a long time to measure potentials of many electrodes.

Since it is also difficult to increase (or elongate) the size of one electro-optic crystal, a range of measurement by single scan cannot be set so wide. The techniques according to the second and third references do permit simultaneous measurement of many electrodes in the lump, but inevitably measure portions other than the electrodes as well.

It is thus necessary to provide a new checking apparatus for array electrode substrate to check an array electrode substrate with an extremely large number of electrodes arranged therein, for example such as a liquid crystal display panel.

An object of the present invention is to provide a checking apparatus for array electrode substrate that can perform a check of an array electrode substrate in which a lot of unit electrodes are regularly and two-dimensionally arranged, in a short time and with high accuracy.

The present invention provides a checking apparatus for checking an array electrode substrate in which unit electrodes are two-dimensionally arranged. The electrode array includes a plurality of unit electrodes to be measured for potential which are aligned in a first direction, and are arranged in plural rows at predetermined row intervals in a direction perpendicular to the first direction.

Apparatus includes a probe assembly having two probe arrays. Each array includes a plurality of electro-optic probes each sized in a length along the array direction covering a plurality of unit electrodes, arranged at a predetermined pitch, wherein the electro-optic probes in one probe array are arranged in a staggered relation with respect to the electro-optic probes in the other probe array. A probe light source outputs a plurality of measurement light beams corresponding to the respective electro-optic probes in the probe assembly. Deflectors respectively deflect each of the plural measurement light beams from the probe light source in the array direction or in an oblique direction thereto. An optical system lets the plural measurement light beams deflected by the deflectors enter the plurality of respective electro-optic probes. An optical path changing device changes the optical paths of plural reflection-return light beams from the plural measurement light beams entering the plurality of electro-optic probes. Photo-detectors detect the plural reflection-return light beams changed in optical path by the optical path changing device for each of the plurality of electro-optic probes and a moving device effects relative movement between the probe assembly and the array electrode substrate by a row interval of the electrode arrays in the direction perpendicular to the array direction at cycles of deflection of the measurement light beams by the deflectors.

The structure according to the present invention includes the plurality of electro-optic probes arranged in staggered relation in the probe assembly, and the arrangement using the plural (for example, eight, sixteen, twenty, forty, and so on) small electro-optic probes is thus equivalent to an arrangement of an elongate electro-optic probe, whereby potentials of many unit electrodes can be simultaneously measured. Namely, because the photo-detectors detect each reflection-return light from a measurement light beam guided into each electro-optic probe, potentials of unit electrodes corresponding in number to the electro-optic probes can be simultaneously measured. Since the deflection of the measurement light beams in the array direction or the oblique direction thereto is synchronized with the relative movement between the electrode arrays and the probe assembly in the direction perpendicular to the array direction, after measurement of an electrode array in a certain line, measurement of an electrode array in a next line can be started thereby consequently enabling continuous potential measurement.

In one aspect of the invention, the probe light source may have a plurality of semiconductor lasers each for outputting a plurality of measurement light beams, and the photo-detectors means may have a plurality of photosensors each for detecting a plurality of reflection-return light beams. This arrangement can achieve a checking apparatus for array electrode substrate which is simple in structure of the light source and photo-detectors and which has extremely high practicality.

In another aspect, the moving device may have a stage on which the array electrode substrate is mounted and which moves the array electrode substrate in the direction perpendicular to the array direction. This arrangement realizes the relative movement between the array electrode substrate and the probe assembly simply by driving the stage while keeping the apparatus main body stationary.

In another aspect, the apparatus may be arranged to have a pulse drive source for supplying to the array electrode substrate a pulse drive signal for bringing one unit electrode into a potential for measurement plural times within a time when the measurement light beam as deflected by the deflecting means is incident into an electro-optic probe in a region corresponding to the one unit electrode. This arrangement can achieve accurate measurement of potentials of unit electrodes in a state that the array electrode substrate is driven while keeping the measurement light beams in the form of continuous light.

In a further aspect, the apparatus may be arranged so that the electro-optic probes are formed of a material which exhibits a photoconductive effect with light of a shorter wavelength than that of the measurement light. The apparatus may further include a dc drive source for supplying a dc drive signal to the array substrate to bring the unit electrodes into a measurement potential, a light source for irradiating the plurality of electro-optic probes with the above light of the shorter wavelength, and a chopper means for effecting blinking of irradiation of the above light of the shorter wavelength onto an electro-optic probe within a time when the measurement light beam as deflected by the deflector is incident into the electro-optic probe in a region corresponding to a unit electrode. This arrangement can realize potential measurement of unit electrodes while dc-driving the array electrode substrate. Namely, the photoconductive effect with irradiation of chopping light cancels index changes of electro-optic probes due to the electro-optic effect, whereby the result can be made equivalent to the case where the array electrode substrate is pulse-driven.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 12 is a drawing of one checking unit to illustrate a measuring method;

DESCRIPTION OF THE PREFERRED EMBODIMENTS

Figure 1:
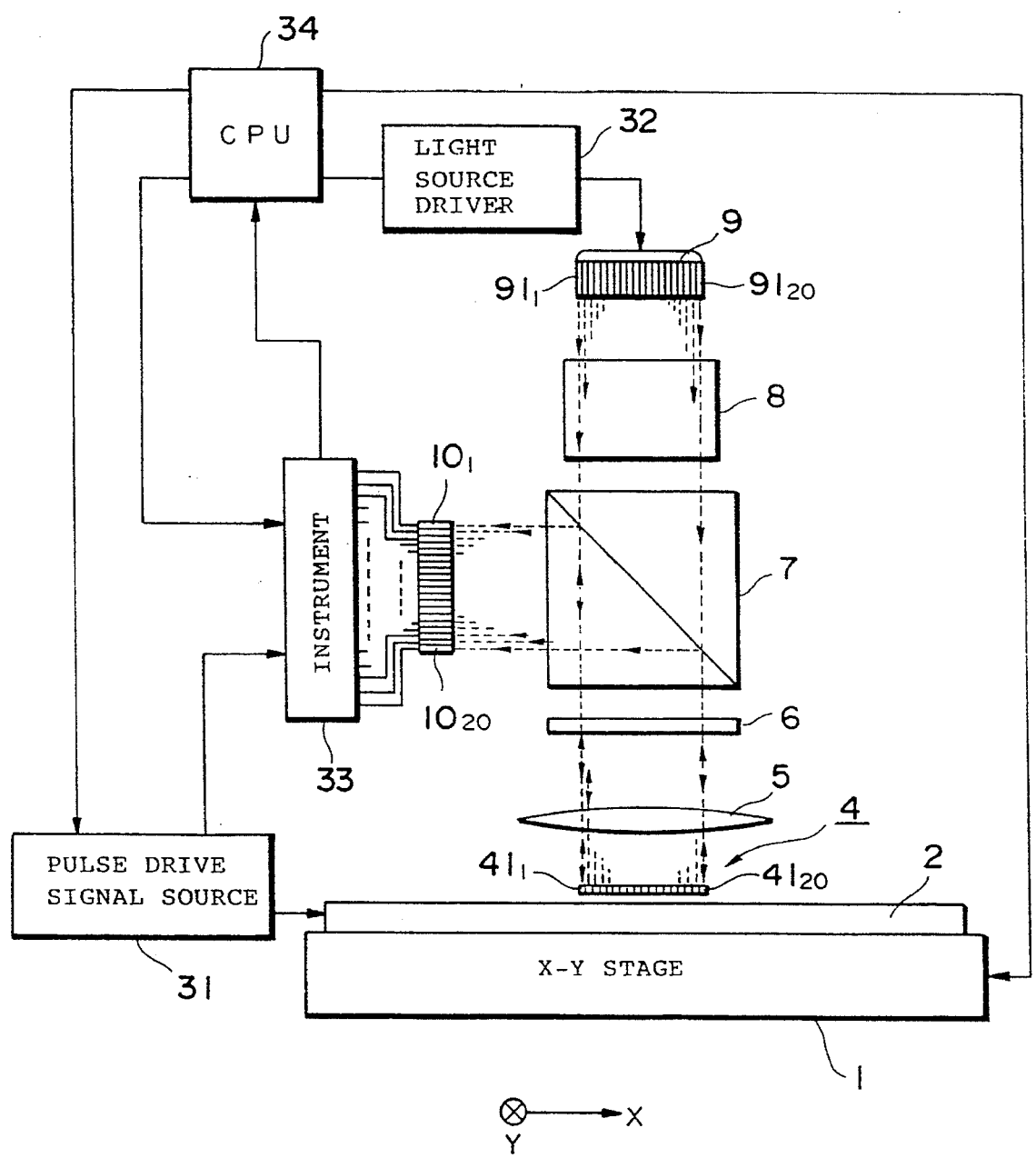
FIG. 1 is a drawing to show the overall structure of a checking apparatus for array electrode substrate of one embodiment of this invention.

Some embodiments of the present invention will be described with reference to the accompanying drawings. The same elements will be denoted by the same reference numerals, and redundant description will be omitted.

First a liquid crystal display, which is an object to be measured, will be described.

Figure 16A:
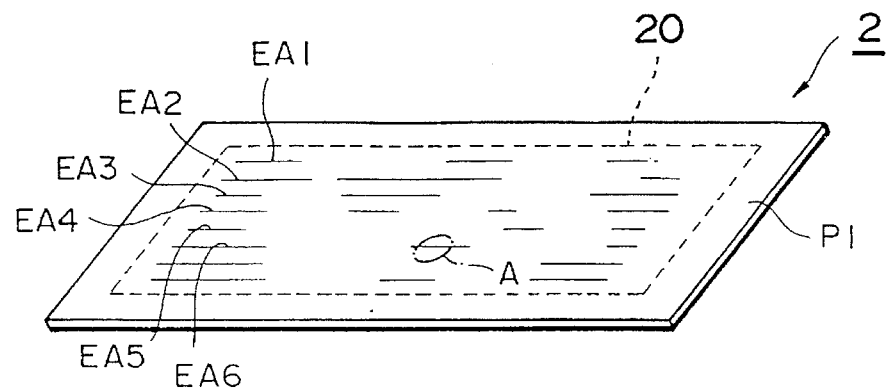
FIGS. 16A and 16B are drawings of a black and white LCD panel.
Figure 16B:
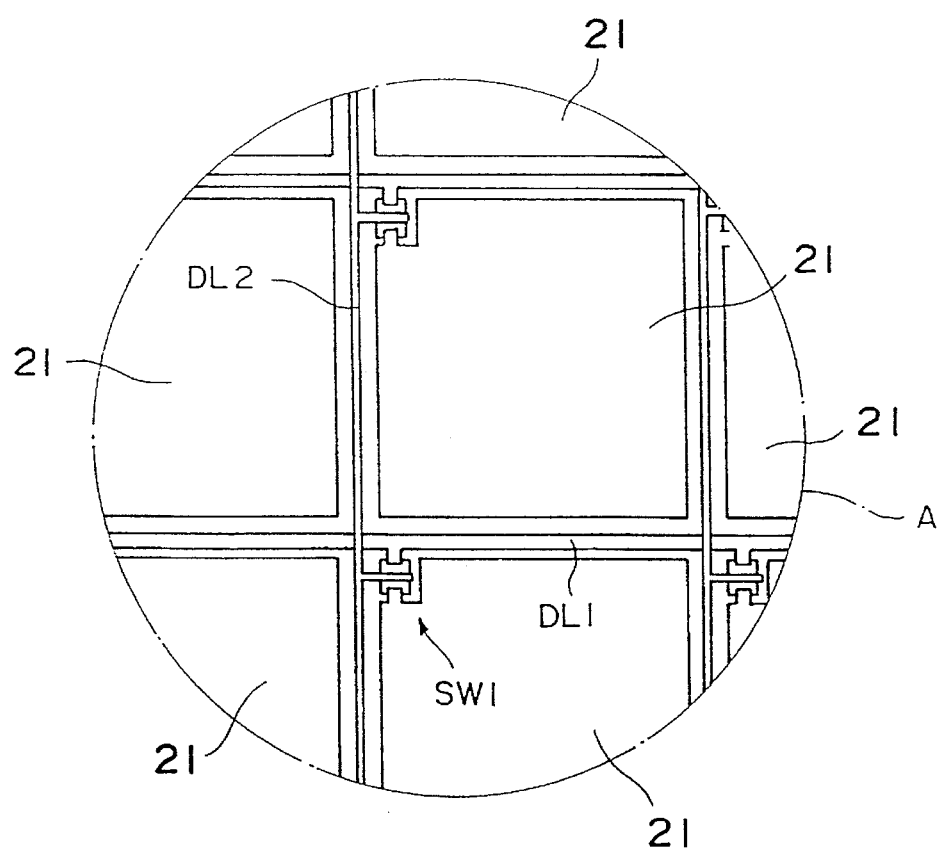
Figure 17:
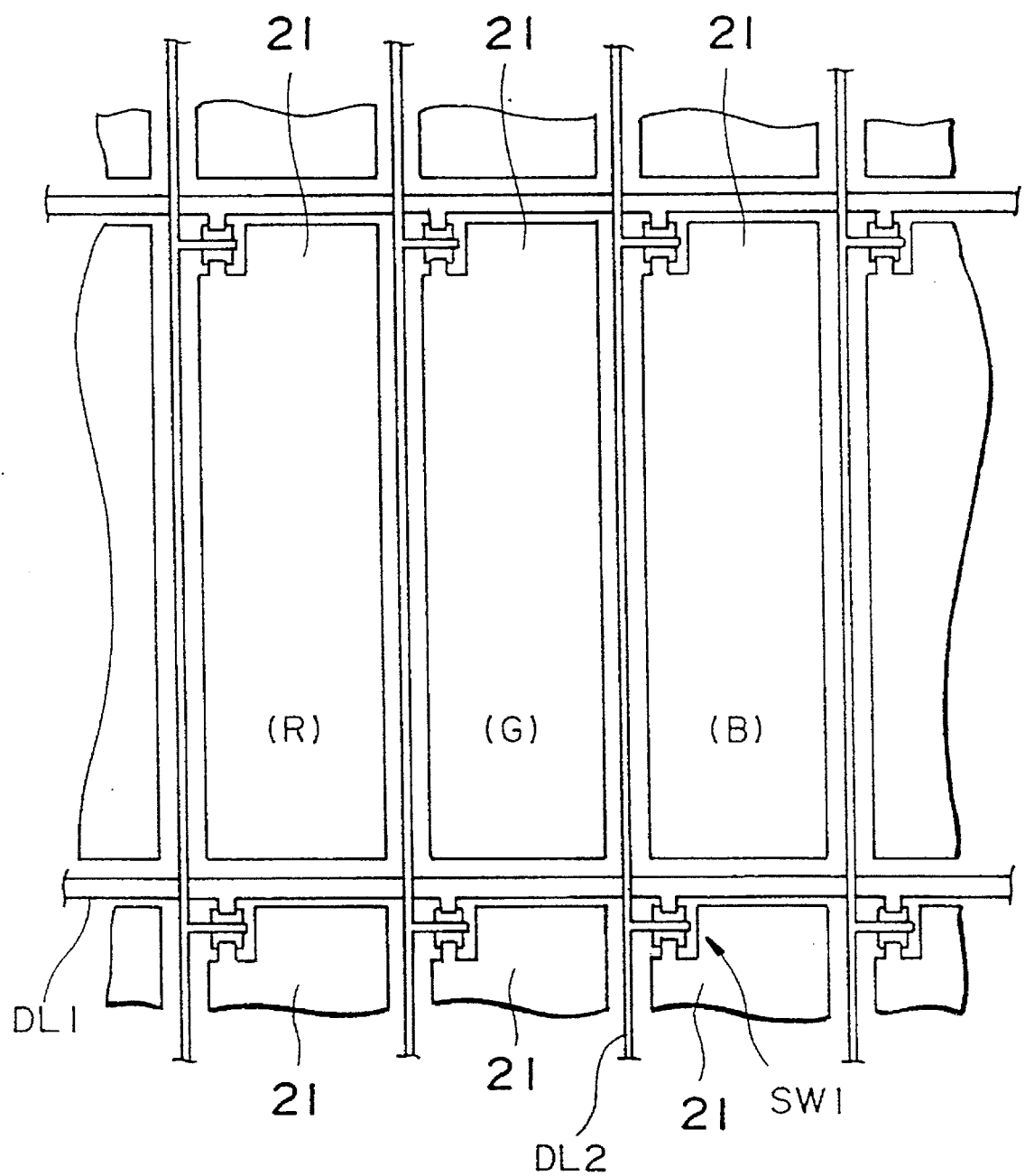
FIG. 17 is a drawing of a color LCD panel.

A liquid crystal display panel 2, which is one type of array electrode substrate, is constructed for example as shown in FIG. 16A, FIG. 16B, or FIG. 17. FIG. 16A shows a liquid crystal display panel for black and white display. FIG. 16B is an enlarged drawing of the region A in FIG. 16A. In a pixel electrode array area 20 of a top surface of a glass panel P1, an electrode array EA1 is constructed of nearly square pixel electrodes (unit electrodes) 21 regularly formed in the horizontal direction of the drawing. Electrode arrays EA2–EA6 having the same structure as the electrode array EA1 are arranged in the vertical direction of the drawing, perpendicular to the longitudinal direction of electrode arrays, so that the unit electrodes are arranged in a two-dimensional array or a matrix on the panel. The plural unit electrodes shown in the drawings have the same structure and the all unit electrodes are denoted by reference numeral 21. Data lines DL1 run in the array direction (row direction) between the unit electrodes 21 and scan lines DL2 run in the direction perpendicular to the array direction. At intersecting points between the data lines and the scan lines, thin-film transistors (TFT) SW1 are formed as switches for turning on or off application of voltage to the unit electrodes as pixel electrodes. The liquid crystal display panel as a display device is constructed by locating a liquid crystal material in position on the panel P1 and providing a common electrode on the opposite surface (the liquid crystal material and the common electrode are not shown). In the following description, the array direction of the electrode array EA1 is defined as a row direction (X direction) while the direction perpendicular thereto as a column direction (Y direction).

A liquid crystal display panel for color display is formed, for example, as shown in FIG. 17. Although the color LCD panel is different from the black and white LCD panel in that the pixel electrodes 21 include those of three colors, R (red), G (green), and B (blue), and in that color filters of R, G, and B (not shown) are provided, the other structure is substantially the same as that of the black and white LCD panel. Also in case of the color display panel, the unit electrodes 21 are arranged like strips in the array direction to form an electrode array and a lot of electrode arrays are arranged in the direction perpendicular to the array direction, whereby the unit electrodes 21 are arranged in a matrix.

A liquid crystal display panel of the above structure, for example a color VGA of 640 dots×480 dots×3 colors, includes 921,600 pixels per panel or unit electrodes as pixel electrodes.

Next the apparatus for checking such liquid crystal displays (LCDs) will be described.

Figure 2A:
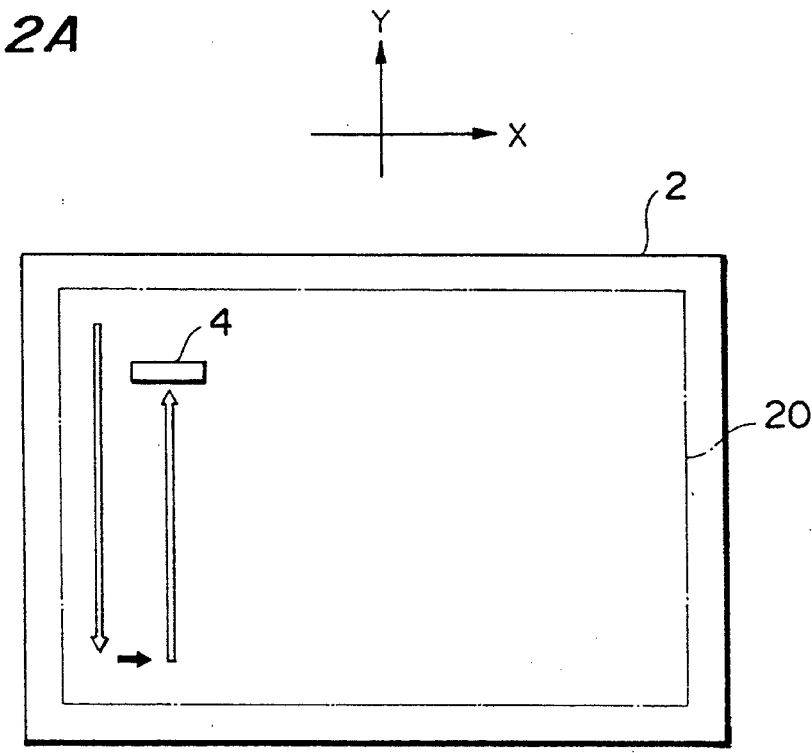
FIGS. 2A–2C are drawings to show relations between a liquid crystal panel and E-O probes.
Figure 2B:
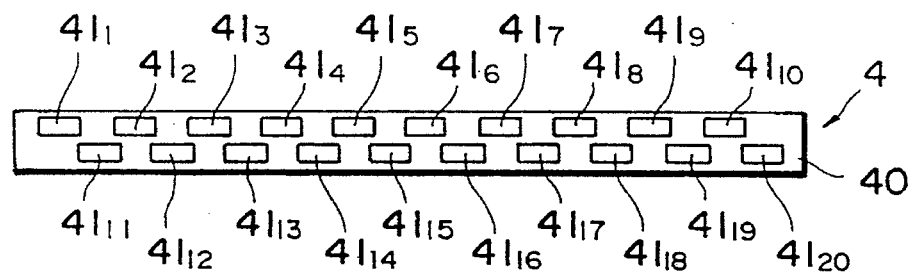
Figure 2C:
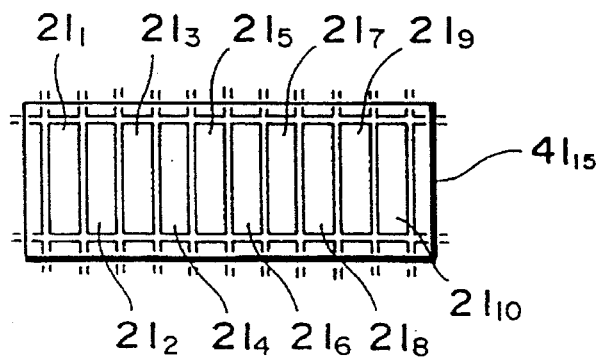

FIG. 1 is a drawing to illustrate the basic structure of a checking apparatus for an array electrode substrate according to a first embodiment, and FIGS. 2A–2C are drawings to show relations between an array electrode substrate and a probe assembly in this embodiment. In this embodiment, the checking apparatus is formed of a combination of twenty checking units in total. In the example of FIG. 1, constituent elements other than lasers as an example of the probe light source, electro-optic probes, and photosensors are common to the detecting units, but they may be independently provided for every unit.

As shown in FIG. 1, the LCD panel 2 for color display is mounted as an example of the array electrode substrate on a rod face of an X-Y stage 1, and the X-Y stage 1 is arranged as movable in the X direction and the Y direction. An output terminal of a pulse drive signal source 31 is connected to an electrode terminal (scan signal input terminal) of the LCD panel 2. A pulse signal voltage is applied to a unit electrode 21 (FIG. 2C) of a pixel electrode through a data line DL1 to which a dc bias is applied, where a TFT switch is turned on in synchronization with application of a pulse signal to a scan line DL2 in the LCD panel 2.

Above the X-Y stage 1, a probe assembly 4 is placed in the vicinity of the top surface of LCD panel 2. This probe assembly 4 includes twenty probes 41 ($41_1$–$41_{20}$) in total, made of an electro-optic material and arranged in the staggered relation, as shown in FIG. 2B. Namely, the probes $41_1$–$41_{10}$ form a first probe array, and probes $41_{11}$–$41_{22}$ form a second probe array. The electro-optic probes of these probe arrays are in the staggered relation. The probes $41_1$–$41_{10}$ in the upper line and the probes $41_{11}$–$41_{20}$ in the lower line are arranged in the positional relation in which both ends thereof slightly overlap with each other, and a distance between the centers of the upper probe array and the lower probe array is set to the arrangement pitch in the vertical direction (Y direction), of the electrode arrays (arrays of unit electrodes 21) on the LCD panel 2 to be checked, or to an integral multiple thereof. The electro-optic probe 41 is formed of an electro-optic crystal of $LiTaO_3$ and dielectric mirror fixed to a bottom surface of the electro-optic crystal. The electro-optic crystal may be ZnTe.

A probe unit or probe assembly 4 is formed of a single support plate (supporting member) 40 and twenty probes $41_1$–$41_{20}$ fixed to the supporting member 40, and the probe assembly 4 is made physically integral. As shown by arrows in FIG. 2A, the probe assembly 4 scans from the upper left corner to the lower right corner on the electrode area (display area) 20 in the top surface of LCD panel 2. This scan is carried out by a combination of X-directional drive and Y-directional drive of the X-Y stage 1.

Figure 5:
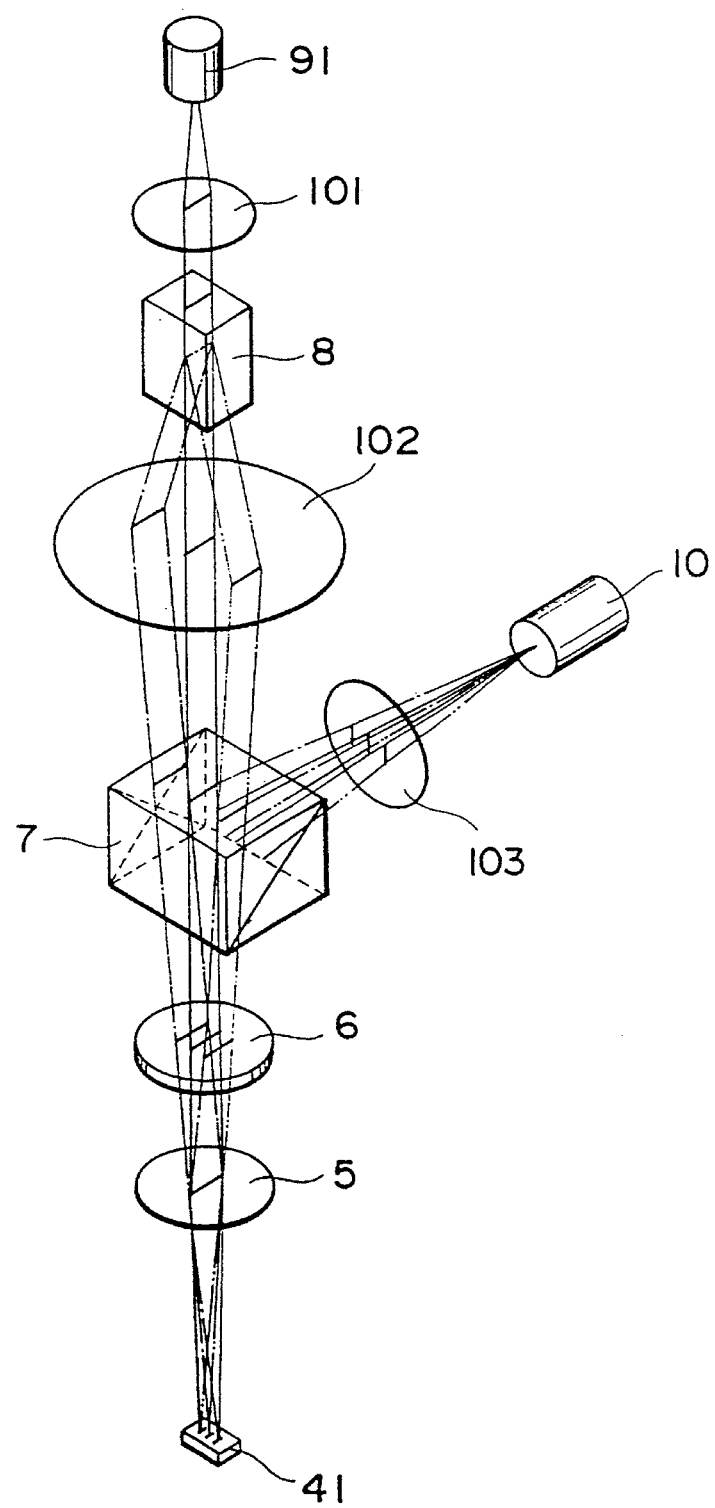
FIG. 5 is a perspective view to show an optical system of a checking unit.

Above the probe assembly 4 there are a focusing lens 5, a one-eighth wave plate 6, a polarizing beam splitter 7, a deflector 8, and a laser light source 9 from the side of the X-Y stage 1 as shown in FIG. 5. The laser light source 9 has twenty semiconductor lasers $91_1$–$91_{20}$ in total corresponding to the probe assembly 4, and twenty measurement laser light beams output therefrom are deflected in the X direction by the externally controlled deflector 8 to pass through the polarizing beam splitter 7 to become linearly polarized laser light and then to enter the one-eighth wave plate 6. The one-eighth wave plate gives an optical bias to change the laser light into elliptically polarized light, and thereafter the twenty measurement laser beams focused by the focusing lens 5 are incident into the corresponding probes $41_1$–$41_{20}$ in the probe assembly 4.

The measurement laser beams are reflected by respective mirrors (not shown) on the bottom surfaces of the probes $41_1$–$41_{20}$ to become reflection-return light beams, which return through the focusing lens 5 and the one-eighth wave plate 6 to the polarizing beam splitter 7. On this occasion, an optical bias of one-eighth wave is given to each of the measurement laser beams and the reflection-return light beams when passing through the one-eighth wave plate 6. Therefore, the elliptically polarized light of measurement laser beams is incident into the respective probes $41_1$–$41_{20}$, while the polarizing beam splitter 7, which the linearly polarized light of measurement laser beams has entered, receives the circularly polarized reflection-return light traveling in the opposite direction. Accordingly, the polarizing beam splitter 7 reflects about a half of the light of the circularly polarized reflection-return light, and the thus reflected light beams each enter twenty photosensors $10_1$–$10_{20}$.

Here, if the twenty probes $41_1$–$41_{20}$ have index changes due to electric fields from the adjacent unit electrodes 21, polarization states of the reflection-return light beams change depending upon the index changes from the circular polarization into different states. Thus, quantities of light reflected by the polarizing beam splitter 7 are also changed, so that the twenty photosensors $10_1$–$10_{20}$ receive light in quantities according to the electric fields each applied to the twenty probes $41_1$–$41_{20}$. This enables simultaneous potential measurement of the twenty unit electrodes 21 on the LCD panel 2.

In FIG. 1, a light source driver 32 drives the light source 9. The light source 9 is formed of twenty semiconductor lasers $91_1$–$91_{20}$, and the light source driver 32 is a circuit for turning on the twenty semiconductor lasers $91_1$–$91_{20}$ with continuous emission (CW emission). An instrument 33 obtains data corresponding to the electric fields applied to the unit electrodes 21 in the LCD panel 2, based on outputs from the twenty photosensors $10_1$–$10_{20}$, and has twenty measurement channels or measurement units corresponding to the twenty photosensors $10_1$–$10_{20}$. The measurement operation will be detailed later on.

A CPU 34 is formed, for example, of a personal computer, which functions to synchronize movement of the LCD panel 2 with movement of the X-Y stage 1, pulse drive of the LCD panel 2 by the pulse drive signal source 31, and instrumentation operation by the instrument 33, and determines which electrode out of the numerous unit electrodes 21 in the LCD panel 2 is malfunctioning, based on the data supplied from the instrument 33. These control and instrumentation operation will be described later on.

The present embodiment has the probe assembly 4 in which the twenty probes $41_1$–$41_{20}$ are arranged in the staggered relation, as shown in FIG. 2B, and each probe $41_1$–$41_{20}$ covers a region of ten unit electrodes 21 continuously adjacent to each other, as shown in FIG. 2C. As a consequence, one probe assembly 4 can cover a region of unit electrodes 21 of 20×10=200. Namely, in each of the twenty units a measurement laser light beam is deflected in the array direction (or in an oblique direction to the array direction) by the deflector 8, so that the measurement laser light beams can be radiated to the region of 200 unit electrodes 21 as deflecting the respective measurement laser light beams by ten steps.

The pulse drive signal source 31 drives the LCD panel 2 so as to bring a unit electrode 21 into an on (voltage-applied) state at least once in a time when a measurement laser light beam is radiated onto an area of a certain unit electrode 21, whereby information about a potential of the unit electrode 21 can be optically obtained.

Further, the control unit 34 drives motors 14, 15 for the X-Y stage 1 so that the probe assembly 4 is located on electrode arrays in next lines on the LCD panel 2 after completion of one deflection of measurement laser light beams by the deflector 8 formed for example of a galvano mirror or an acousto-optic deflector, thereby moving the stage 11. After that, the deflector 8 starts a next deflection operation of measurement laser light beams to perform the potential measurement in the same manner.

After the measurement operation from the upper edge to the lower edge in the Y direction is completed by repeating the above measurement, the X-Y stage 1 is driven in the X direction and then movement in the Y direction is restarted after completion of movement by the length of the probe assembly 4 (FIG. 2A). Repeating this process hereinafter, measurement is carried out for the entire surface of the electrode area 20 on the LCD panel 2 having a two-dimensional spread.

Next, the constitution and operation of the above embodiment will be detailed using a simplified model with a decreased number of units.

Figure 3:
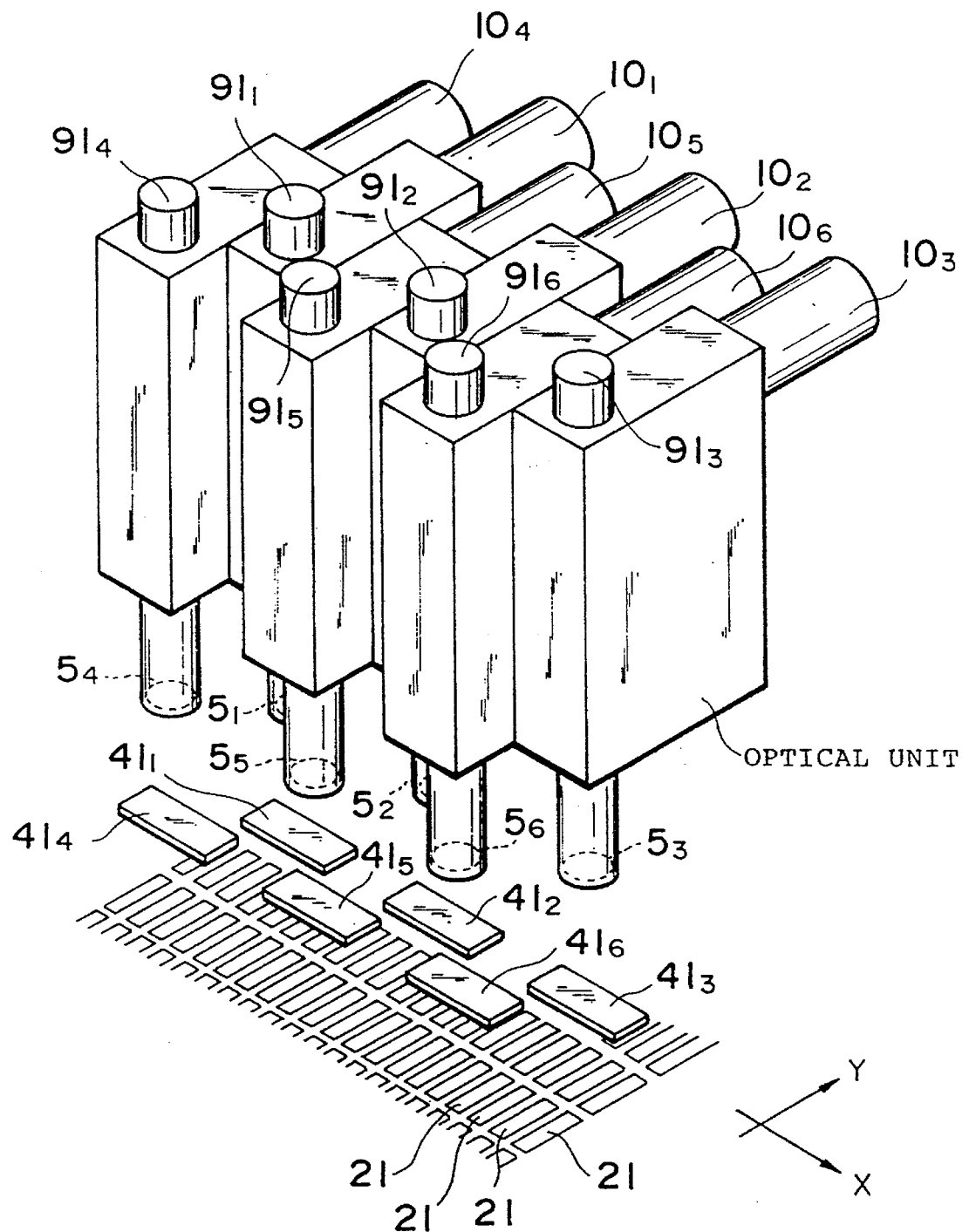
FIG. 3 is a perspective view to diagrammatically show the overall structure.

FIG. 3 is a perspective view to schematically show an example of a checking apparatus including six checking units. Each of the six checking units is formed from of an optical unit including a polarizing beam splitter 7 and a deflector 8 shown in FIG. 1, a focusing lens 5 (indicated by $5_1$–$5_6$) attached thereto, a photosensor 10 (indicated by $10_1$–$10_6$), and a semiconductor laser 91 (indicated by $91_1$–$91_6$). The bottom surface of the probe 41 (indicated by $41_1$–$41_6$) is set as sufficiently close to the unit electrode 21 on the LCD panel 21, so that electric lines of force due to a potential of the unit electrode 21 affect the probe 41 to change an index of refraction thereof.

As apparent from FIG. 3, a line (a row line in the array direction) of unit electrodes 21 corresponding to three probes $41_1$–$41_3$ in the upper line is a line above (in the +Y direction) a line of unit electrodes 21 corresponding to the three probes $41_4$–$41_6$ in the lower line. This arrangement can be realized by arranging the probes $41_1$–$41_6$ in the staggered relation and making the arrangement pitch of probes 41 in the upper line and the lower line equal to the row pitch in the direction (the column direction) perpendicular to the array direction (the row direction), of the unit electrodes 21.

The staggered arrangement of the probes $41_1$–$41_6$ as described results in a staggered arrangement of the optical units in addition to the focusing lenses $5_1$–$5_6$, optical sensors $10_1$–$10_6$, and semiconductor lasers $91_1$–$91_6$ as shown in FIG. 3. A common optical unit or a common focusing lens may replace the optical units or the focusing lenses $5_1$–$5_6$, as shown in FIG. 1.

Figure 4:
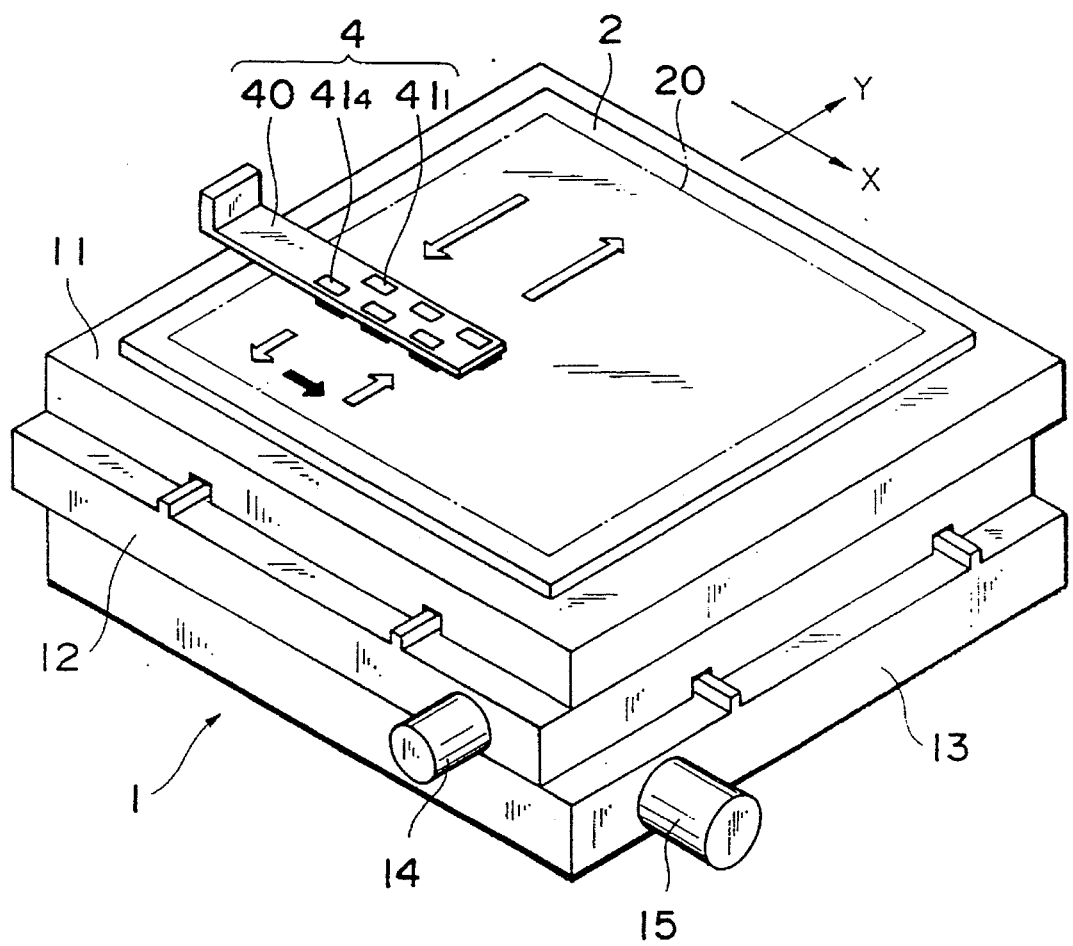
FIG. 4 is a perspective view to show a relation between an X-Y stage and E-O probes.

FIG. 4 is a perspective view to show the X-Y stage 1 and the probe assembly 4. The X-Y stage 1 is provided with a top plate (stage) 11 on which the LCD panel 2 is mounted, a Y-drive plate 12 for moving the top plate 11 in the Y direction along guides, and an X-drive plate 13 for moving the Y drive plate 12 in the X direction along guides. A Y drive motor 14 is attached to the Y-drive plate 12, and an X drive motor 15 is attached to the X-drive plate 13. Accordingly, the stage 11 moves in the Y direction with drive of the Y drive motor 14, while the stage 11 is moved in the X direction with drive of the X drive motor 15.

The apparatus of FIG. 4 operates in the following manner. First, the LCD panel 2 is mounted on the top plate 11, and the probe assembly 4 drops together with the optical systems etc. so as to bring the bottom surface of the probe assembly 4 into a sufficiently close relation to the top surface of the LCD panel 2, as shown in FIG. 2A. At the beginning of measurement the probe assembly 4 is located at the upper left edge (in the –X direction and the +Y direction) of display area 20 in the LCD panel 2.

After start of measurement, as already described, the deflector 8 deflects the six measurement laser light beams toward the respectively corresponding probes $41_1$–$41_6$ in the X direction. On this occasion, the Y drive motor 14 gradually moves the top plate 11 in the Y direction. The Y-directional movement of stage 11 is continuous.

After one round deflection of measurement laser light beams by the deflector 8, the probes $41_1$–$41_6$ move to adjacent lines (adjacent electrode arrays in the Y direction) of electrode array formed of unit electrodes 21 in the display area 20. Thus, deflection of the deflector 8 in the next cycle makes the measurement laser light beams incident into a region of lines next to the previous lines.

After the above operation is repeated by a number of unit electrodes 21 in the Y direction in the LCD panel 2 (more accurately, by a number of unit electrodes 21 in the Y direction plus 1), a cycle of Y-directional potential measurement is completed. Then the Y drive motor 15 stepwise moves the Y drive plate 12 in the –X direction, and then deflection of the measurement laser light beams by the deflector 8 is repeated as starting movement in the –Y direction this time.

The above movement control by the X-Y stage 1 is specifically described below. Here, let us consider an example to measure electric properties of an LCD panel of color VGA (640 dots×480 dots×3 colors=921,600 pixels) for one minute per panel. Suppose that an effective length of the probe assembly 4 in the array direction is 20 mm, that an effective length of each probe 41 in the array direction is 1 mm, and that each probe 41 covers ten unit electrodes 21 (the pitches of which are 300 μm×100 μm and a size of which is determined as large as possible). This setting allows measurement of 200 pixels by a single scan, and thus, it is necessary to move the LCD panel 2 640×3/200=9.6 times, that is, ten times X-directional movement for measurement of the entire LCD panel 2.

In this case because a distance of single Y-directional movement from the top edge to the bottom edge of LCD panel 2 is 300 μm×400=144 mm, a total length of movement is 144 mm×10=1,440 mm. Then, in order to complete this movement for one minute, a moving speed of the X-Y stage 1 in the Y direction is 24 mm/sec, which can be surely realized by a mechanical X-Y stage 1.

Namely, because the present embodiment is so arranged that the X-Y stage 1 moves not stepwise but at constant speed in the Y direction (the direction perpendicular to the array), the embodiment enables potential measurement of an extremely great number of pixels (unit electrodes) in a short time. If stepwise movement should be required, such movement must be extremely difficult because an instantaneous acceleration at start or stop of movement is extremely high and weights of the X-Y stage 1 and LCD panel 2 are considerably high.

FIG. 5 is a perspective view to show an arrangement of each checking unit, particularly an arrangement of an optical system. As shown, a measurement laser beam output from a semiconductor laser 91 is collimated by a collimator lens 101 and the collimated beam enters the deflector 8. The deflector 8 deflects the measurement laser light beam back and forth at nearly constant angular velocity in the array direction (or in an oblique direction thereto), whereby the measurement laser light beam as deflected is incident through a lens 102 into the polarizing beam splitter 7.

After the beam passes through the polarizing beam splitter 7, the measurement laser light beam becomes a linearly polarized light beam. Then the linearly polarized light beam is provided with an optical bias of a one-eighth wave by the one-eighth wave plate 6. Namely, the measurement laser light beam becomes elliptically polarized, and the elliptically polarized light is then incident through the focusing lens 5 onto the probe 41. Reflected light from the bottom face of probe 41, which is reflection-return light of the measurement laser light beam, is approximately elliptically polarized light, but a polarization state thereof is different from elliptical polarization depending upon an index change of the probe 41 itself due to an electrical field applied to the probe 41.

This reflection-return light travels through the focusing lens 5 and the one-eighth wave plate 6 again into the polarizing beam splitter 7, whereby the optical path of the return light is changed by 90°. On this occasion passage through the one-eighth wave plate 6 again gives an optical bias of a one-eighth wave, so that the reflection-return light entering the polarizing beam splitter 7 becomes approximately circularly polarized light, though the polarization state thereof is changed by a change amount of refractive index of probe 41.

Because of this, a quantity of light deflected by the polarizing beam splitter 7 is 50% for circularly polarized light, whereas for polarized light with deviation of polarization from circular polarization, a quantity of reflection-return light incident through a lens 103 into the photosensor 10 differs depending upon a degree of the deviation. Thus, the electric field applied to the probe 41 can be obtained from the intensity of detection of light by the photosensor 10.

Figure 6:
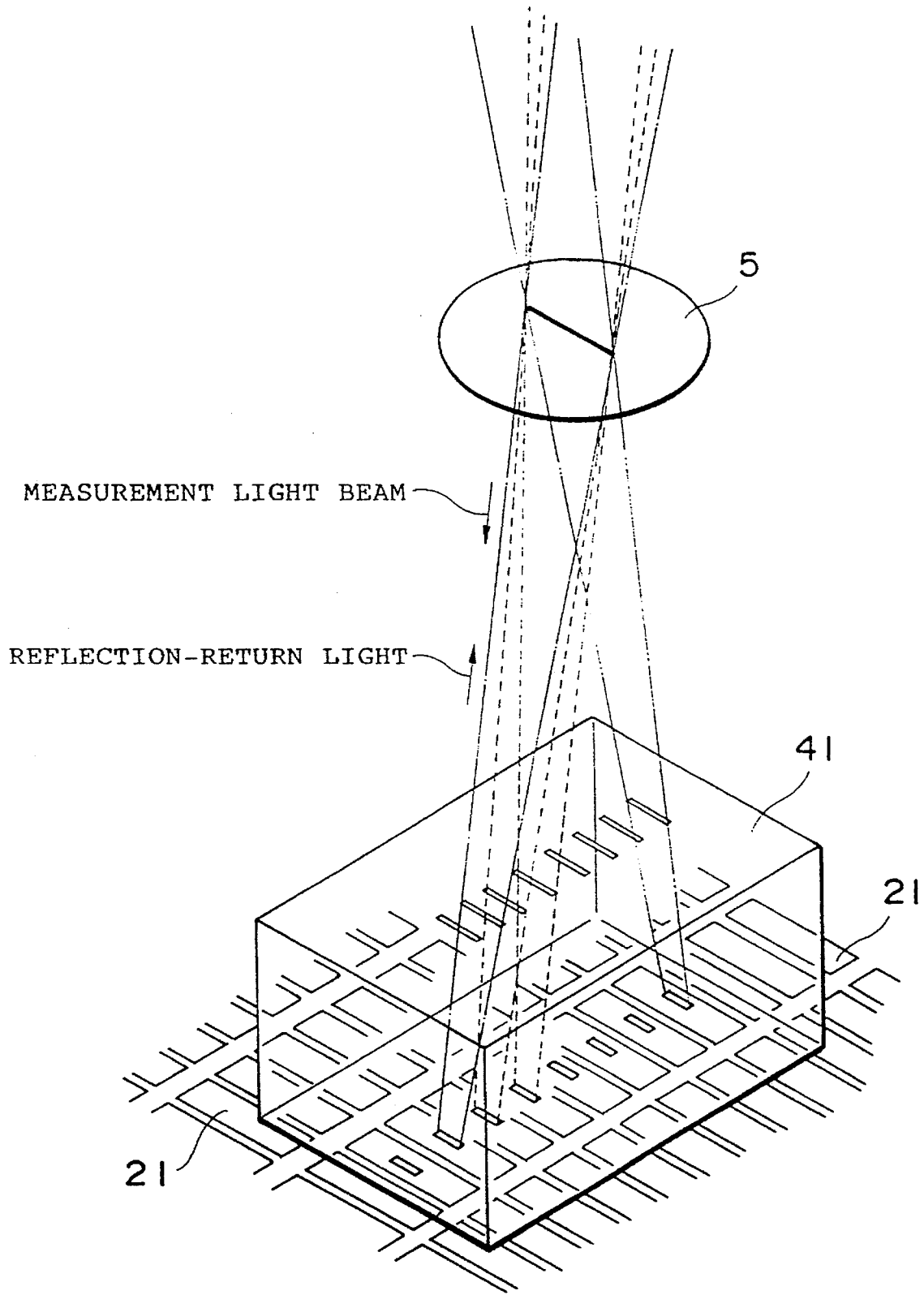
FIG. 6 is a perspective view to show a relation between E-O probes and measurement laser light beams.

FIG. 6 is a perspective view to diagrammatically show a state in which a measurement laser light beam as deflected is incident into the probe 41 and is reflected thereby. In the illustrated example, the probe 41 covers a region of eight unit electrodes 21, and the measurement laser light beam is gradually deflected in the array direction from one end (the lower left side of FIG. 6) to the other end (the upper right side of FIG. 6) to scan the probe 41. Accordingly, within a time when the measurement laser light beam is incident into the probe 41 in the region corresponding to the eight unit electrodes 21, the polarization states of reflection-return light include information about potentials of the eight unit electrodes 21.

Some examples of measurement techniques according to the present invention are next described referring to FIGS. 7A–7F to FIGS. 11A–11F. To simplify the description, let us suppose that one probe 41 covers a region of four unit electrodes 21a–21d (21) and that the probe assembly 4 has six probes 41 for covering first to sixth areas, respectively.

Figure 7A:
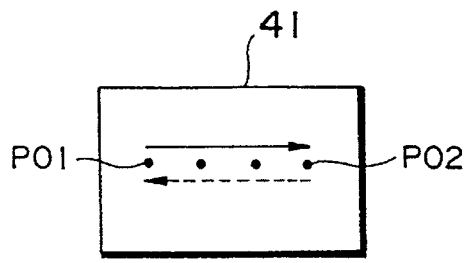
FIGS. 7A–7F are drawings to show a parallel scan method.
Figure 7C:
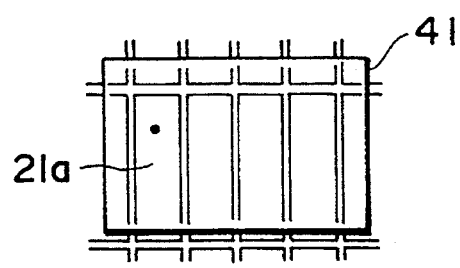
Figure 7D:
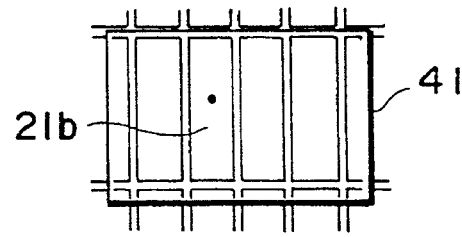
Figure 7B:
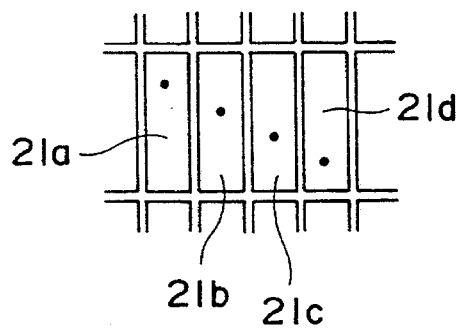
Figure 7E:
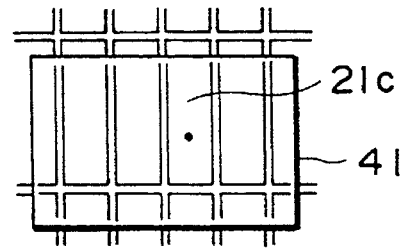
Figure 7F:
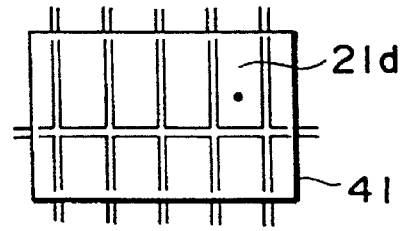

FIGS. 7A–7F show a parallel scan method for deflecting the measurement laser light beams in a direction parallel to the longitudinal direction (array direction) of the probes 41. Black dots in the drawings represent spot positions of a measurement light beam. As shown in FIG. 7A, the spot of measurement laser light beam gradually moves from left to right of probe 41 as indicated by the solid arrow, potentials are measured for the unit electrodes 21a–21d in the LCD panel 2 as changing the position from up to down as shown in FIG. 7B. After that, the spot of measurement light beam gradually returns from right to left as indicated by the dotted arrow as shown in FIG. 7A. This is because the LCD panel 2 is moved by the X-Y stage mechanism 1 while the measurement laser light beam is scanned by the deflector 8. Here, the measurement is carried out upon the movement in the direction of the solid arrow but is not done upon the return movement in the direction of the dotted arrow.

FIGS. 7C–7F are separate drawings to show how the incident areas of the measurement laser light beam change from the left unit electrode 21a to the right unit electrode 21d. The left unit electrode 21a is irradiated in a region about a quarter of the height apart from the top edge, with the measurement laser light beam, whereas the right unit electrode 21d is irradiated in a region about a quarter of the height apart from the lower edge, with the measurement laser light beam. When the light spot is in the return of the dotted arrow, the measurement laser light beam is radiated to the vicinity of the border of each unit electrode. A scanning speed of the beam from right to left in FIG. 7A is equal to that from left to right. For the scan from a first point (spot) PO1 to a second point (spot) PO2 in FIG. 7A, the control unit 34 controls the deflector 8 and the drive unit 15 so that the drive unit 15 moves the stage 11 by a half of the length of each electrode 21 in the column direction Y relative to the probe assembly 4 while each light beam scans an area between the first point PO1 and the second point PO2 of the electro-optic probe 41 by deflecting the each light beam by the deflector 8. As shown in FIG. 7A, a line connecting the first point PO1 with the second point PO2 of the each electro-optic probe 41 is parallel to the row direction (longitudinal direction) of the electro-optic probe 41.

FIGS. 8A–8D show a method of scanning of a region of electrode arrays formed of unit electrodes 21 of 4×6=24 with six measurement laser light beams for six corresponding areas, first to sixth areas, by the parallel scan method of FIGS. 7A–7F. In FIGS. 8A–8D, let us suppose that the first to sixth areas are covered by six corresponding probes $41_1$–$41_6$. Further, solid dots represent irradiation positions of the measurement laser light beams, that is, areas under measurement of potentials with beams impinging on the electrodes 21. White dots represent regions after measured with the measurement laser light beams incident thereto and crosses represent regions where the measurement laser light beams were made incident but no potential measurement was carried out.

Figure 8A:
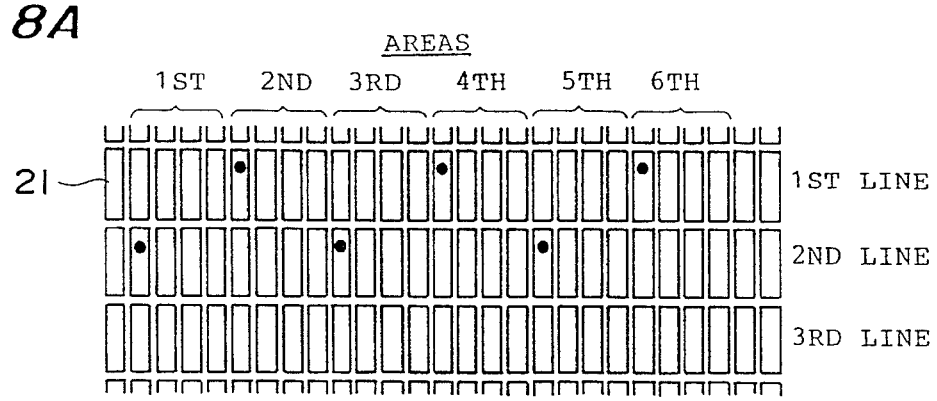
FIGS. 8A–8D are drawings to show a parallel scan method.
Figure 8B:
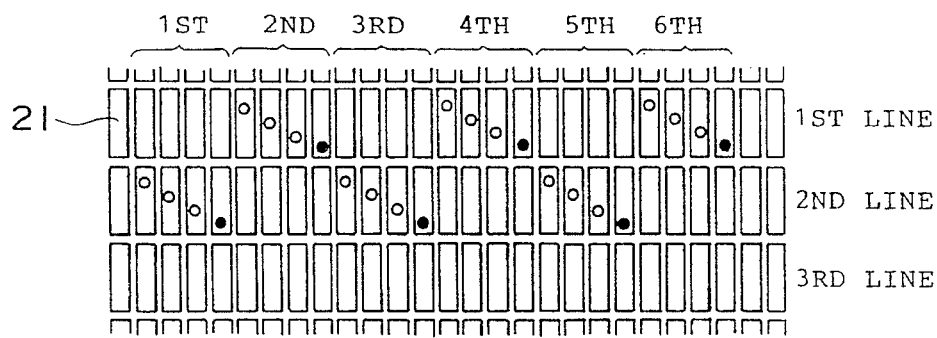
Figure 8C:
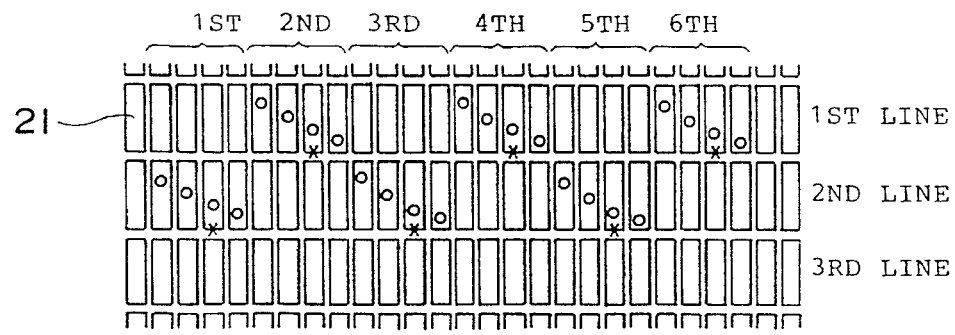

As shown in FIG. 8A, measurement starts from the left unit electrodes 21 in the first line of the second, fourth, and sixth areas and in the second line of the first, third, and fifth areas, and a position of the measurement is about a quarter from the upper edge of each unit electrode 21. Then measurement is continued, as shown in FIG. 8B, up to the right unit electrode 21 in each area, and a position of the measurement comes to about a quarter from the lower edge of each unit electrode 21. Namely, when the X-Y stage 1 moves by a half of the vertical arrangement pitch of unit electrodes 21, half-way deflection by the deflector 8 is ended.

Figure 8D:
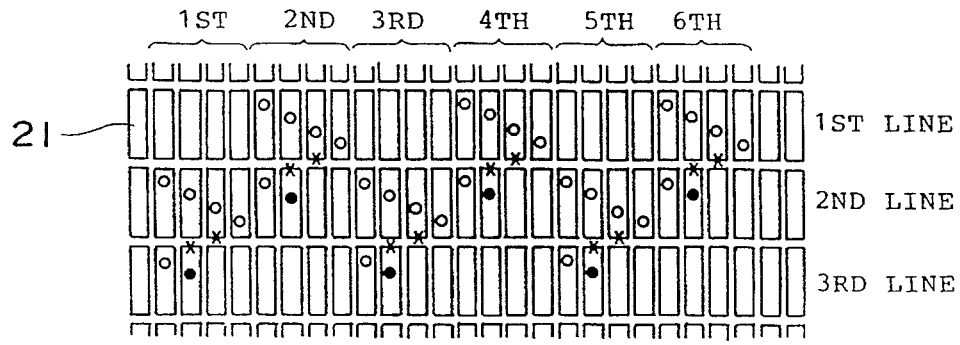

After completion of measurement of four unit electrodes 21 in this manner, the measurement laser light beams are deflected in the return direction (FIG. 8C), and the beams move through regions of the borders between two unit electrodes, so as to reach regions of the left unit electrodes 21 in the next line. At this time, the measurement position is about a quarter from the top edge of each left unit electrode 21. Namely, a time necessary for deflection of one cycle of the measurement laser light beams by the polarizing beam splitter 7 is set equal to a time necessary for movement of the LCD panel 2 by a row pitch of electrode arrays in the direction perpendicular to the array direction. After that, the scan is repeated in the same manner as shown in FIG. 8D.

More specifically describing the above parallel scan method, first supposing the vertical pitch of unit electrodes 21 is 300 μm, the horizontal pitch of unit electrodes 21 is 100 μm, and one probe 41 covers ten unit electrodes 21, a sufficient length of probes 41 is 1000 μm+α where α is a marginal length of probes 41.

When a quarter of the left-end unit electrode 21 from the top edge comes to above the measurement line, the measurement laser light beam starts being radiated and then the beam is deflected to the right unit electrodes 21. When the measurement laser light beam is radiated to the right-end unit electrode 21, which is the tenth unit electrode, the irradiated position is arranged to be located at a quarter of the unit electrode 21 from the lower edge. Specifically, the X-Y stage 1 is controlled to move by 300 μm/2=150 μm in the Y direction during the period in which the measurement laser light beam is scanned from left to right by 10×100 μm=1000 μm in the X direction.

Figure 9A:
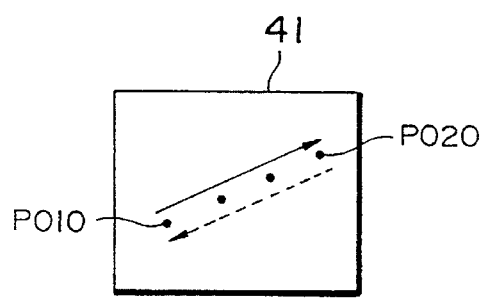
FIGS. 9A–9F are drawings to show an oblique scan method.
Figure 9B:
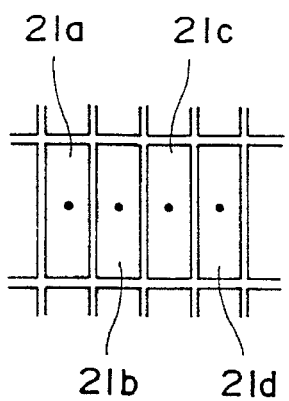
Figure 9C:
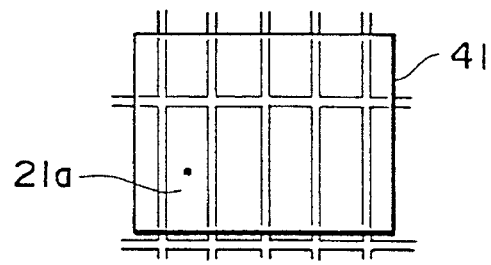
Figure 9D:
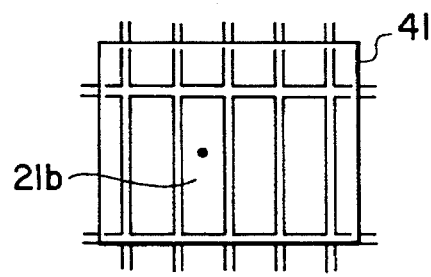
Figure 9E:
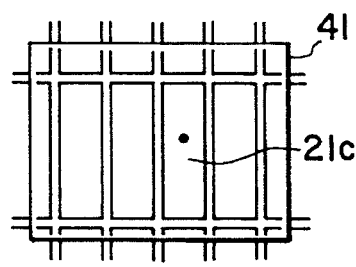
Figure 9F:
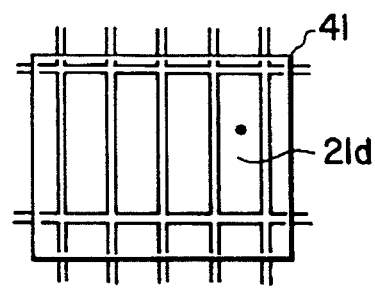
Figure 10A:
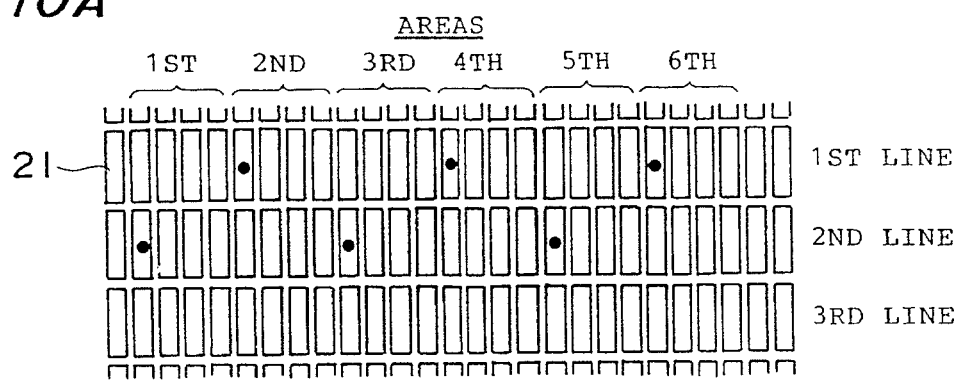
FIGS. 10A–10D are drawings to show an oblique scan method.
Figure 10B:
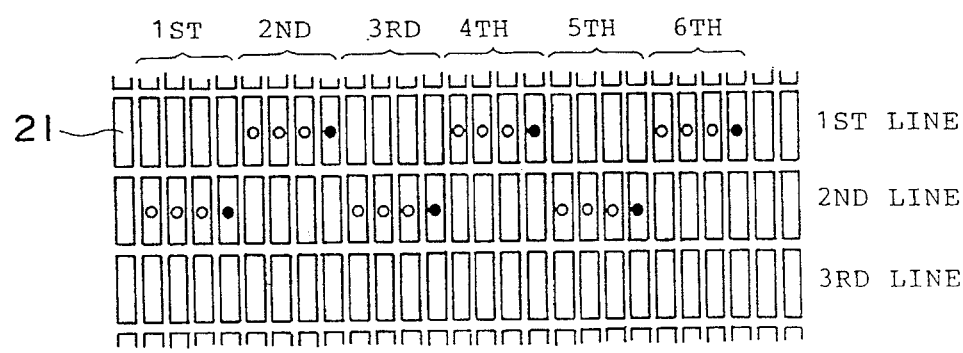
Figure 10C:
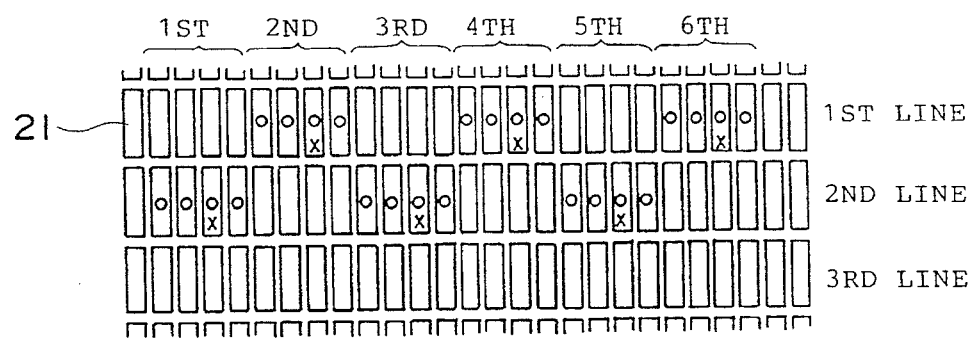
Figure 10D:
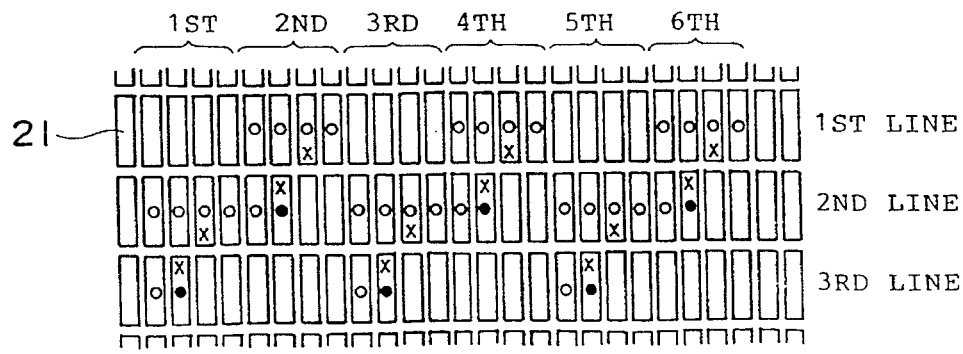
Figure 11A:
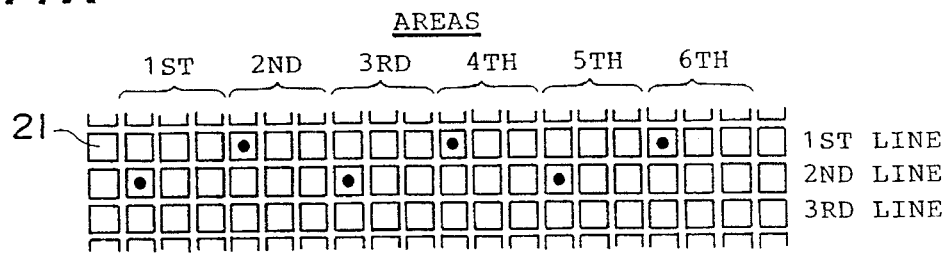
FIGS. 11A–11E are drawings to show an oblique scan method.
Figure 11B:
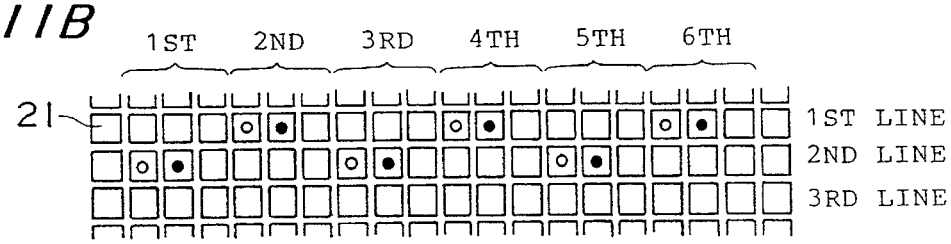
Figure 11C:
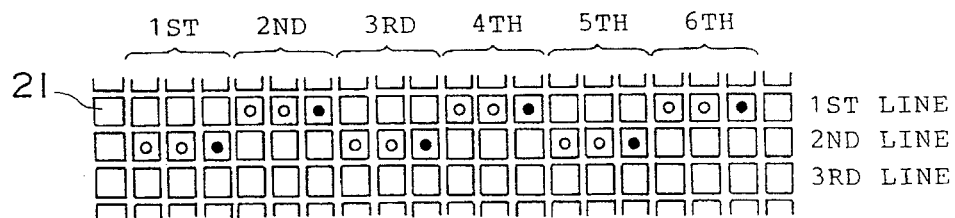
Figure 11D:
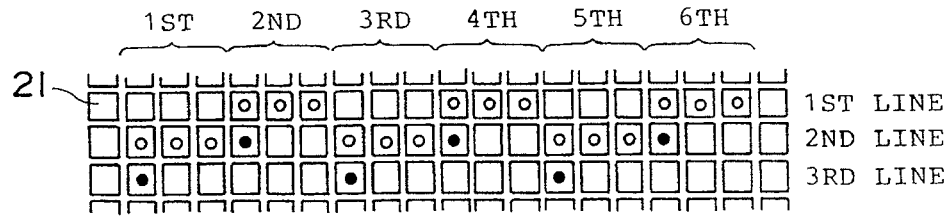
Figure 11E:
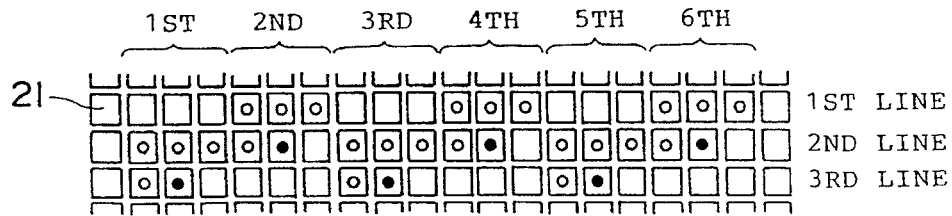

FIGS. 9A–9F show an oblique scan method in which the measurement laser light beam is deflected obliquely to the longitudinal direction of probe 41. The scan in this case is achieved by inclining the deflector 8 obliquely to the probe 41. As shown in FIG. 9A, the measurement laser light beam is scanned to the upper right as indicated by the solid line, and then is returned to the lower left as indicated by the dotted line. The potentials are measured at nearly same positions for the unit electrodes 21a–21d, as shown in FIG. 9B. This is because the X-Y stage 1 moves the LCD panel 2 during the scan of the measurement laser light beam. The control unit 34 controls the deflector 8 and drive unit 15 so that the drive unit 15 moves the stage 11 by a half of the length of each electrode 21 in the row direction Y relative to the probe assembly 4 while the each light beam is scanned between a first point PO10 and a second point PO20 of each electro-optic probe 41 as deflecting the each light beam by the deflector 8. Namely, a row-directional component of a scan speed of the light beam scanned on a line connecting the first point PO10 with the second point PO20 of electro-optic probe 41 is equal in magnitude but opposite in direction to a row-directional component of a relative speed of the stage 11 relative to the probe assembly 4.

FIGS. 9C–9F show how the irradiation position of the measurement laser light beam changes in order from the left unit electrode 21a to the right unit electrode 21d. Employing such an oblique scan, the potential measurement of unit electrodes 21 in the first to sixth areas by the six probes $41_1$–$41_6$ are carried out as shown in FIGS. 10A–10D.

The example in FIGS. 10A–10D is different from the example of FIGS. 8A–8D in that the potential measurement with the measurement laser light beams is always carried out with respect to the central portions of unit electrodes 21. Because of this, the oblique scan method is suitable for potential measurement of unit electrodes 21 which are not as long in the direction perpendicular to the array direction. FIGS. 11A–11E shows one example of this case where the individual unit electrodes are approximately square.

More specifically describing the oblique scan method, when a lot of unit electrodes 21 arrayed at pitches of 300 μm in the vertical direction and 100 μm in the horizontal direction are measured with probes 41 each covering ten unit electrodes 21, the measurement laser light beams are obliquely scanned by 100 μm×10=1000 μm in the horizontal direction (X direction) and 150 μm in the vertical direction (Y direction) while the X-Y stage 1 moves by 300 μm/2=150 μm in the vertical direction (Y direction). In this manner, the measurement laser light beams are incident at positions of a same height (in the Y direction) of the unit electrodes 21 and return to positions of a same height of unit electrodes 21 in the next line.

Figure 13:
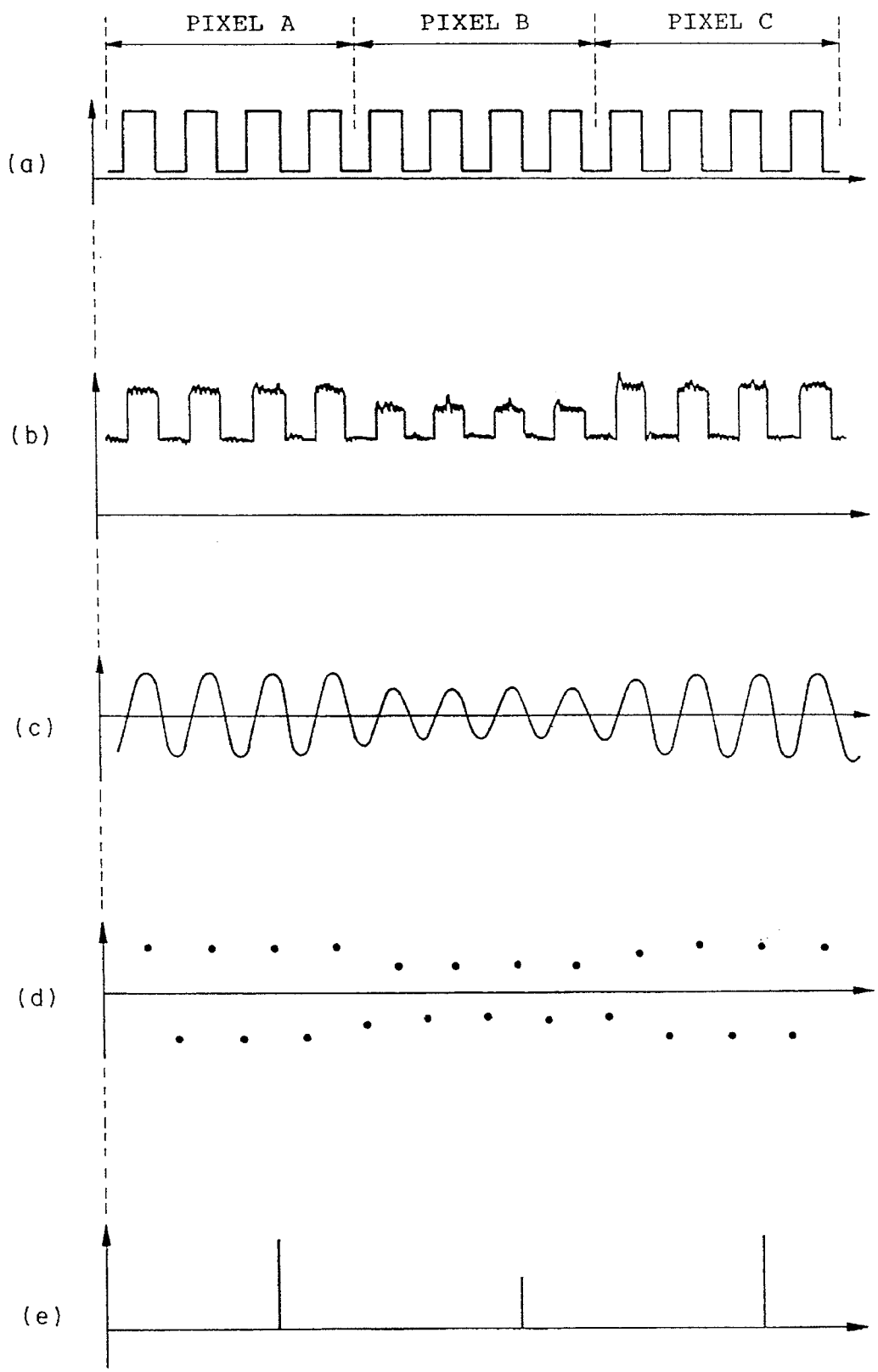
FIG. 13 is waveform diagrams to illustrate real time detection measurement with the system of FIG. 12.
Figure 14:
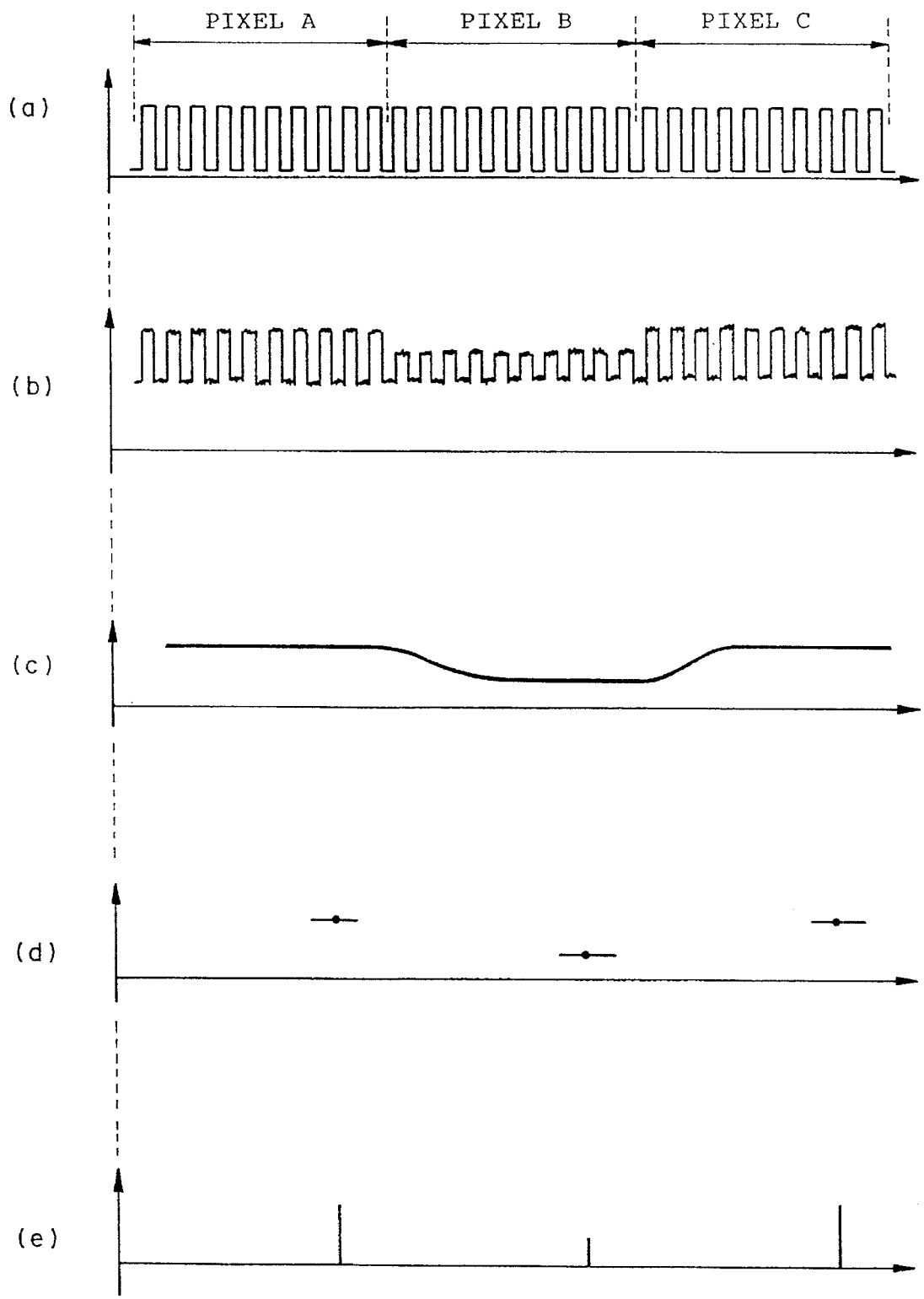
FIG. 14 is waveform diagrams to show synchronous detection measurement with the system of FIG. 12.

Next, the method for measuring potentials of unit electrodes in the embodiment is described particularly as to real time detection measurement (FIG. 13) and synchronous detection measurement (FIG. 14).

FIG. 12 is a structural drawing of a checking unit for describing these measurement methods, which is one detecting unit extracted from FIG. 1. As shown, the measurement laser light beam from the semiconductor laser 91 is deflected back and forth by the deflector 8, then is converted into linearly polarized light by the polarizing beam splitter 7, and thereafter is changed into elliptically polarized light for example by the one-eighth wave plate 6, thereby entering the probe 41 to scan. On this occasion, potentials of unit electrodes 21 on the LCD panel 2 are changed pulsewise by the pulse drive signal source 31, and reflection-return light with changes of polarization states due to the potential changes is changed in optical path by the polarizing beam splitter 7 and then is incident into the photosensor 10.

The color VGA panel includes an extremely large number of pixels; in the aforementioned example, the number of all pixels is 921,600. Since the potential measurement is not carried out in the return path of scan with the measurement laser light beams, a measurement time per pixel is 60 sec×20 probes/(921,600 pixels×2 scans)=0.65 msec. In case of the real time detection measurement of pixels as described below with FIG. 13, a sufficient frequency of an electric signal for driving the panel is over 1/0.65 msec=1.54 kHz. In case of the synchronous detection measurement using a lock-in amplifier etc. as described below with FIG. 14, a sufficient frequency for driving the panel is one over some multiple of the above frequency.

In case of checking for LCD panels etc., there is no need to observe a detailed waveform of a voltage to be measured, but it is sufficient to know only a value of the voltage. Since we would like to know whether a pixel is defective or not, it is sufficient to know the difference between a defective pixel and a good pixel there is no need to know an absolute value of the voltage for each pixel. Considering such circumstances, the method for detecting the signal can be considerably simplified as shown in FIG. 13 or FIG. 14.

In FIG. 13, (a)–(d) show waveform diagrams when the real time detection measurement is carried out with the system of FIG. 12. The horizontal axis represents the time while the vertical axis the voltage. Here, the pulse drive signal source 31 and instrument 33 operate in synchronization with each other, but for simplicity, the description herein is based on such an arrangement that a unit electrode 21 in the LCD panel 2 is pulse-driven four times within a time when the measurement laser light beam is incident into a region of the one unit electrode 21.

FIG. 13(a) shows a waveform of a drive signal to the unit electrodes 21 in the LCD panel 2, in which four pulses are applied to each of pixels A, B, C. Under the aforementioned conditions this arrangement results in 4×1.54 kHz=6.16 kHz. Then a region of probe 41 corresponding to each unit electrode 21 is given an electric field changing pulsewise similarly, and thus, a photodetection output signal detected by the photosensor 10 changes as shown in FIG. 13(*b*).

An output from the photosensor 10 is passed through a band-pass filter (high-frequency cut filter), whereby noise in the high-frequency region is cut and the dc component is eliminated (dc correction), presenting the waveform as shown in FIG. 13(*c*). This band-pass filter is a narrow-band filter with the center frequency at the frequency of the drive signal by the pulse drive signal source 31, which removes the dc bias and the noise as described above.

Sampling a maximum value and a minimum value in each cycle of the pulse drive from the output, a resultant waveform is as shown in FIG. 13(*d*). Then, taking as an output value a difference between a maximum value and a minimum value upon the third cycle of pulse drive in each pixel A, B, C, final outputs are as shown in FIG. 13(*e*). In this manner, it is seen that appropriate potentials are given to the pixels A, C, but the potential is insufficient for pixel B, which causes a malfunction of the unit electrode 21 corresponding to the pixel B.

FIG. 14 shows waveform diagrams when the synchronous detection measurement is carried out with the system of FIG. 12. In this example, a reference signal from the drive signal source 31 for the LCD panel 2 is applied to the instrument 33, and the instrument 33 consisting of a lock-in amplifier etc. performs synchronous detection measurement based on the reference signal. Since an equivalent frequency bandwidth in the synchronous detection measurement can be further narrowed than that in the above real time measurement method, the synchronous detection measurement can yield better S/N ratios.

However, because the synchronous detection measurement needs more time to stabilize the output than the real time detection measurement method, a drive signal with more cycles is necessary as shown in FIG. 14(*a*). An output signal from the photodetector 10 is similar to that in the real time detection method, and an output from the synchronous detector slowly changes as shown in FIG. 14(*c*). Peaks are held from the output, and holding timings are times when the output shown in FIG. 14(*c*) from the lock-in amplifier detector becomes constant. FIG. 14(*d*) shows a state after peaks are held in this manner. A final output of FIG. 14(*e*) includes output values thus held, from which it is determined that the pixel B is defective. In checking panels, the determination can be made only from the output values.

Figure 15:
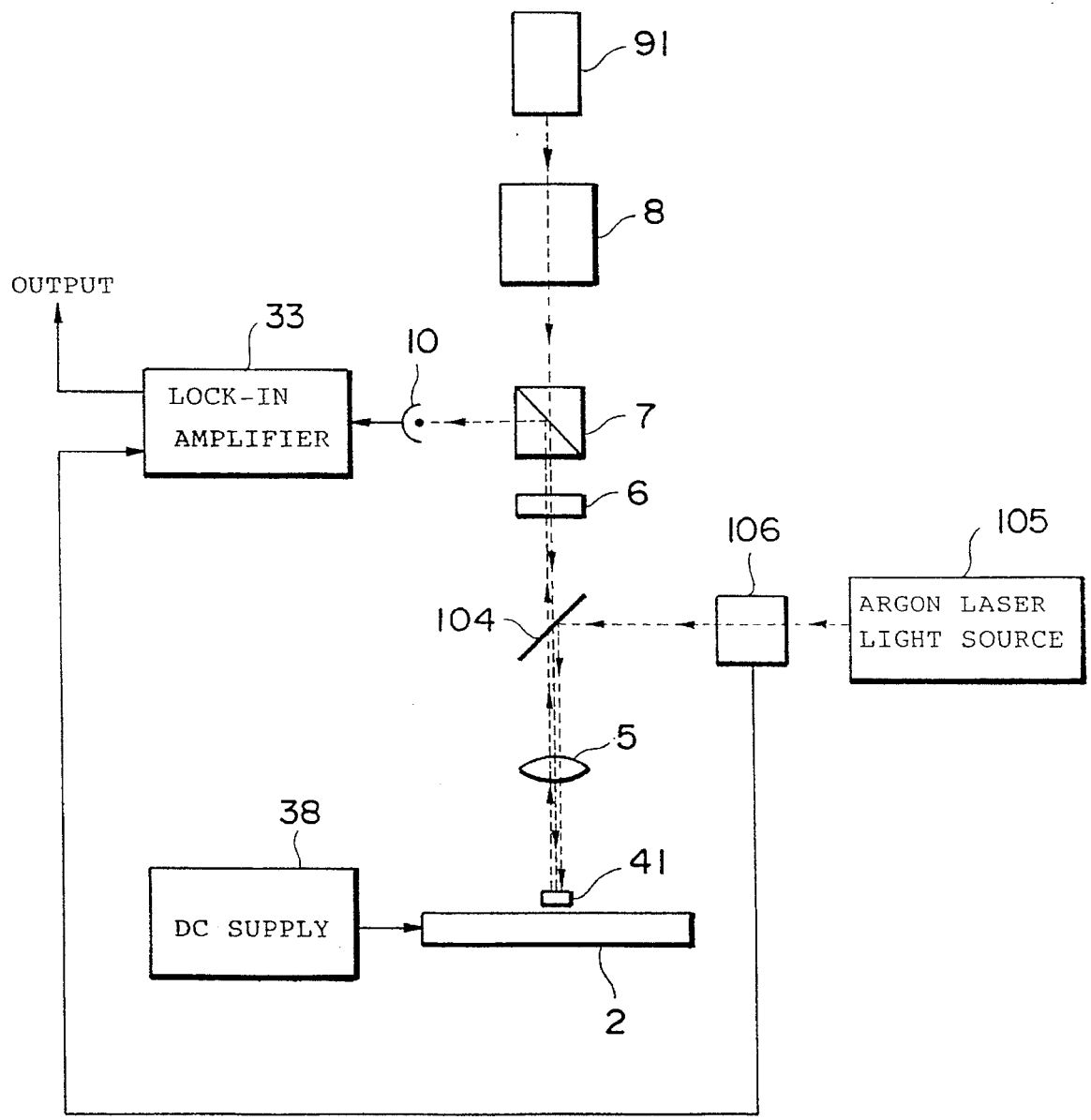
FIG. 15 is a structural drawing of a checking unit to which measurement by the specific resistance modulation method is applied.

In the above embodiment the ac drive signal was supplied from the pulse drive signal source 31 to the LCD panel 2, but some electrode arrangements of LCD panel 2 will accept only applications of a dc voltage. FIG. 15 shows a measuring method for solving such a problem, i.e., the specific resistance modulation method.

FIG. 15 shows an embodiment in which a voltage in measured devices (unit electrodes 21 in the LCD panel 2) is a dc voltage. The E-O probes 41 forming the probe assembly 4 are made of a crystal having both properties of the electro-optic effect and the photoconductive effect, for example ZnTe. CW semiconductor laser diodes of a wavelength 780 nm are used as a laser light source 91 for probes, and in addition, an Ar$^+$ laser light source of an emission wavelength 514.5 nm is used as a second light source (chopping light source) 105.

A dichroic mirror 104 is disposed on an optical path between the focusing lens 5 and the one-eighth wave plate 6, and the dichroic mirror 104 is so arranged that it transmits the measurement laser light beams from the laser light source 91 for probes but reflects laser light (laser light chopped by a chopper 106) from the Ar$^+$ laser light source 105. Also, a dc voltage is supplied from the dc supply 38 to each unit electrode in the LCD panel 2. Further, the operation of pulse drive means of chopper 106 and the operation of lock-in amplifier 33 are controlled in synchronization with each other.

When light from the Ar$^+$ laser light source 105 is absorbed in the crystal(probes 41), charges are generated in the E-O crystal by the photoconductive effect. As a consequence, the resistance of the crystal drops, so that the voltage applied to the electrodes becomes unlikely to be applied to the E-O probes 41, in other words, the applied voltage to the E-O probes 41 decrease, substantially nullifying the electro-optic effect. When the light from the Ar$^+$ laser is subjected to on-off modulation (pulse modulation) by the chopper 106 and the modulated light is let to enter the E-O probes 41, the E-O effect of ZnTe can be made off and on in synchronization therewith. This is equivalent to the modulation on the measured voltage as shown in FIG. 12, so that measurement becomes possible even with dc voltage applied to the LCD panel 2.

As described above, the checking apparatus for array electrode substrate according to the present invention is arranged so that the probe assembly is formed of a plurality of electro-optic probes arranged in the staggered relation, and use of a plurality of small electro-optic probes becomes equivalent to a construction of an elongate electro-optic probe, thereby enabling non-contact and simultaneous measurement of potentials of numerous unit electrodes. Namely, because the measurement light beams are made incident into the respective electro-optic probes and the photodetector means detects the reflection-return light from the respective measurement light beams, potentials of the same number of unit electrodes as the number of electro-optic probes can be simultaneously measured.

Since the deflection of the measurement light beams in the array direction or in the oblique direction thereto is synchronized with relative movement between the electrode arrays and the probe assembly in the direction perpendicular to the array direction, measurement of an electrode array in a next line can be started after completion of measurement of an electrode array in a certain line, thereby allowing continuous potential measurement and potential measurement of numerous pixels within a short time.

Also, the pulse drive signal is supplied to the array electrode substrate to make the measurement light beams continuous, whereby potentials of unit electrodes can be measured with accuracy; in addition, even if the array electrode substrate is driven by a dc voltage, the potentials of unit electrodes can be measured with a good S/N ratio.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 213804/1994 (6-213804) filed on Sep. 7, 1994 is hereby incorporated by reference.

What is claimed is:

1. An apparatus for checking an article having a plurality of electrodes arranged in a matrix, comprising;

(a) a light source for outputting a plurality of light beams;

(b) a deflector for repetitively deflecting each of said plurality of light beams output from said light source along a row direction to output each light beam therefrom;

(c) a probe assembly having:

a first electro-optic probe array having a plurality of electro-optic probes arranged in said row direction, wherein a length of each of the electro-optic probes in said first electro-optic probe array in said row direction is longer than a length of a line traversing in said row direction at least two adjacent electrodes out of said plurality of electrodes, and a second electro-optic probe array having a plurality of electro-optic probes arranged in said row direction, wherein a length of each of the electro-optic probes in said second electro-optic probe array in said row direction is longer than a length of a line traversing in said row direction at least two adjacent electrodes out of said plurality of electrodes and wherein said plurality of electro-optic probes in said first probe array and said plurality of electro-optic probes in said second probe array are in the staggered relation, wherein each of the electro-optic probes in said first and second electro-optic probe arrays changes a refractive index thereof depending upon an electric field around each electrode of said plurality of electrodes, each light beam of said plurality of light beams output from said deflector is guided into each of the electro-optic probes, so that each light beam is repetitively scanned in said row direction in each electro-optic probe, and each light beam is reflected by each electro-optic probe;

(d) a photodetector for detecting the each light beam reflected by the each electro-optic probe;

(e) a stage on which said article is mounted and which is arranged to be movable in the row direction relative to said probe assembly; and (f) a drive unit for continuously moving said stage relatively to said probe assembly.

2. An apparatus according to claim 1, further comprising a control unit for controlling said deflector and said drive unit so that said drive unit moves said stage by a half of a length of each electrode in the row direction relative to said probe assembly while each light beam is scanned from a first point to a second point of each electro-optic probe as deflected by said deflector.

3. An apparatus according to claim 2, wherein a line connecting said first point with said second point of said each electro-optic probe is parallel to the row direction of said each electro-optic probe.

4. An apparatus according to claim 2, wherein a row-directional component of a scan speed of said each light beam scanned on the line connecting said first point with said second point of said each electro-optic probe is equal in magnitude but opposite in direction to a row-directional component of a relative speed of said stage relative to said probe assembly.

5. An apparatus according to claim 1, wherein said light source has a plurality of semiconductor lasers each for outputting said respective light beams.

6. An apparatus according to claim 1, wherein said photodetector has a plurality of photodetecting sensors.

7. An apparatus according to claim 1, further comprising a pulse drive source for applying a pulse signal with a plurality of pulses to said each electrode while said each light beam traverses a predetermined region in said each electro-optic probe, corresponding to said each electrode.

8. An apparatus according to claim 1, further comprising:

a second light source for radiating second light with a shorter wavelength than a wavelength of said light beam to said plurality of electro-optic probes, said each electro-optic probe coming to exhibit no change of a refractive index thereof when irradiated with said second light;

chopping means for periodically chopping said second light propagating from said second light source to the plurality of electro-optic probes; and a direct current voltage source for supplying a direct current voltage to said each electrode.

9. An apparatus according to claim 8, wherein said electro-optic probes are comprised of ZnTe.

* * * * *